US009041065B2

(12) United States Patent
Wu et al.

(10) Patent No.: US 9,041,065 B2
(45) Date of Patent: *May 26, 2015

(54) SEMICONDUCTOR HETEROSTRUCTURE DIODES

(71) Applicant: Transphorm Inc., Goleta, CA (US)

(72) Inventors: Yifeng Wu, Goleta, CA (US); Umesh Mishra, Montecito, CA (US); Primit Parikh, Goleta, CA (US); Rongming Chu, Goleta, CA (US); Ilan Ben-Yaacov, Goleta, CA (US); Likun Shen, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/973,890

(22) Filed: Aug. 22, 2013

(65) Prior Publication Data
US 2014/0054603 A1  Feb. 27, 2014

Related U.S. Application Data

(60) Continuation of application No. 13/533,339, filed on Jun. 26, 2012, now Pat. No. 8,541,818, which is a division of application No. 13/008,874, filed on Jan. 18, 2011, now Pat. No. 8,237,198, which is a division of application No. 12/332,284, filed on Dec. 10, 2008, now Pat. No. 7,898,004.

(51) Int. Cl.
*H01L 29/739* (2006.01)
*H01L 29/06* (2006.01)
(Continued)

(52) U.S. Cl.
CPC .......... *H01L 29/0615* (2013.01); *H01L 29/778* (2013.01); *H01L 29/7786* (2013.01);
(Continued)

(58) Field of Classification Search
CPC .............. H01L 29/778; H01L 29/7786; H01L 29/7787; H01L 29/475; H01L 29/402; H01L 29/2003
USPC .............. 257/194, 199, 183, E29.195, E33.03
See application file for complete search history.

(56) References Cited

U.S. PATENT DOCUMENTS 4,645,562 A   2/1987  Liao et al.
4,728,826 A   3/1988  Einzinger et al.
(Continued)

FOREIGN PATENT DOCUMENTS

CN      1748320 A     3/2006
CN    101897029 A    11/2010
(Continued)

OTHER PUBLICATIONS

Arulkumaran, et al., "Enhancement of breakdown voltage by AlN buffer layer thickness in AlGaN/GaN high-electron-mobility transistors on 4 in. diameter silicon," Applied Physics Letters, 2005, 86:123503-1-3.
(Continued)

*Primary Examiner* — Victor A Mandala
(74) *Attorney, Agent, or Firm* — Fish & Richardson P.C.

(57) ABSTRACT

Planar Schottky diodes for which the semiconductor material includes a heterojunction which induces a 2DEG in at least one of the semiconductor layers. A metal anode contact is on top of the upper semiconductor layer and forms a Schottky contact with that layer. A metal cathode contact is connected to the 2DEG, forming an ohmic contact with the layer containing the 2DEG.

32 Claims, 19 Drawing Sheets

(51) Int. Cl.
*H01L 29/20* (2006.01)
*H01L 29/205* (2006.01)
*H01L 29/872* (2006.01)
*H01L 27/06* (2006.01)
*H01L 29/778* (2006.01)
*H01L 29/423* (2006.01)

(52) U.S. Cl.
CPC .......... *H01L29/2003* (2013.01); *H01L 29/205* (2013.01); *H01L 29/7787* (2013.01); *H01L 29/872* (2013.01); *H01L 27/0629* (2013.01); *H01L 29/4236* (2013.01)

(56) References Cited

U.S. PATENT DOCUMENTS

| | | | |
|---|---|---|---|
| 4,821,093 A | 4/1989 | Lafrate et al. | |
| 4,914,489 A | 4/1990 | Awano | |
| 5,329,147 A | 7/1994 | Vo et al. | |
| 5,646,069 A | 7/1997 | Jelloian et al. | |
| 5,705,847 A | 1/1998 | Kashiwa et al. | |
| 5,714,393 A | 2/1998 | Wild et al. | |
| 5,998,810 A | 12/1999 | Hatano et al. | |
| 6,008,684 A | 12/1999 | Ker et al. | |
| 6,097,046 A | 8/2000 | Plumton | |
| 6,316,793 B1 | 11/2001 | Sheppard et al. | |
| 6,475,889 B1 | 11/2002 | Ring | |
| 6,486,502 B1 | 11/2002 | Sheppard et al. | |
| 6,515,303 B2 | 2/2003 | Ring | |
| 6,548,333 B2 | 4/2003 | Smith | |
| 6,583,454 B2 | 6/2003 | Sheppard et al. | |
| 6,586,781 B2 | 7/2003 | Wu et al. | |
| 6,649,497 B2 | 11/2003 | Ring | |
| 6,727,531 B1 | 4/2004 | Redwing et al. | |
| 6,777,278 B2 | 8/2004 | Smith | |
| 6,849,882 B2 | 2/2005 | Chavarkar et al. | |
| 6,867,078 B1 | 3/2005 | Green et al. | |
| 6,946,739 B2 | 9/2005 | Ring | |
| 6,979,863 B2 | 12/2005 | Ryu | |
| 6,982,204 B2 | 1/2006 | Saxler et al. | |
| 7,030,428 B2 | 4/2006 | Saxler | |
| 7,045,404 B2 | 5/2006 | Sheppard et al. | |
| 7,071,498 B2 | 7/2006 | Johnson et al. | |
| 7,084,475 B2 | 8/2006 | Shelton et al. | |
| 7,125,786 B2 | 10/2006 | Ring et al. | |
| 7,161,194 B2 | 1/2007 | Parikh et al. | |
| 7,170,111 B2 | 1/2007 | Saxler | |
| 7,230,284 B2 | 6/2007 | Parikh et al. | |
| 7,238,560 B2 | 7/2007 | Sheppard et al. | |
| 7,253,454 B2 | 8/2007 | Saxler | |
| 7,265,399 B2 | 9/2007 | Sriram et al. | |
| 7,268,375 B2 | 9/2007 | Shur et al. | |
| 7,304,331 B2 | 12/2007 | Saito et al. | |
| 7,321,132 B2 | 1/2008 | Robinson et al. | |
| 7,326,971 B2 | 2/2008 | Harris et al. | |
| 7,332,795 B2 | 2/2008 | Smith et al. | |
| 7,364,988 B2 | 4/2008 | Harris et al. | |
| 7,388,236 B2 | 6/2008 | Wu et al. | |
| 7,419,892 B2 | 9/2008 | Sheppard et al. | |
| 7,432,142 B2 | 10/2008 | Saxler et al. | |
| 7,449,730 B2 * | 11/2008 | Kuraguchi | 257/199 |
| 7,456,443 B2 | 11/2008 | Saxler et al. | |
| 7,465,967 B2 | 12/2008 | Smith et al. | |
| 7,501,669 B2 | 3/2009 | Parikh et al. | |
| 7,544,963 B2 | 6/2009 | Saxler | |
| 7,548,112 B2 | 6/2009 | Sheppard | |
| 7,550,783 B2 | 6/2009 | Wu et al. | |
| 7,550,784 B2 | 6/2009 | Saxler et al. | |
| 7,566,918 B2 | 7/2009 | Wu et al. | |
| 7,573,078 B2 | 8/2009 | Wu et al. | |
| 7,592,211 B2 | 9/2009 | Sheppard et al. | |
| 7,612,390 B2 | 11/2009 | Saxler et al. | |
| 7,615,774 B2 | 11/2009 | Saxler | |
| 7,638,818 B2 | 12/2009 | Wu et al. | |
| 7,678,628 B2 | 3/2010 | Sheppard et al. | |
| 7,692,263 B2 | 4/2010 | Wu et al. | |
| 7,709,269 B2 | 5/2010 | Smith et al. | |
| 7,709,859 B2 | 5/2010 | Smith et al. | |
| 7,714,360 B2 * | 5/2010 | Otsuka et al. | 257/194 |
| 7,745,851 B2 | 6/2010 | Harris | |
| 7,755,108 B2 * | 7/2010 | Kuraguchi | 257/199 |
| 7,777,252 B2 | 8/2010 | Sugimoto et al. | |
| 7,812,369 B2 | 10/2010 | Chini et al. | |
| 7,855,401 B2 * | 12/2010 | Sheppard et al. | 257/194 |
| 7,875,537 B2 | 1/2011 | Suvorov et al. | |
| 7,875,914 B2 | 1/2011 | Sheppard | |
| 7,884,395 B2 * | 2/2011 | Saito | 257/199 |
| 7,892,974 B2 | 2/2011 | Ring et al. | |
| 7,893,500 B2 | 2/2011 | Wu et al. | |
| 7,898,004 B2 * | 3/2011 | Wu et al. | 257/194 |
| 7,901,994 B2 | 3/2011 | Saxler et al. | |
| 7,906,799 B2 | 3/2011 | Sheppard et al. | |
| 7,915,643 B2 | 3/2011 | Suh et al. | |
| 7,915,644 B2 | 3/2011 | Wu et al. | |
| 7,919,791 B2 | 4/2011 | Flynn et al. | |
| 7,928,475 B2 | 4/2011 | Parikh et al. | |
| 7,948,011 B2 | 5/2011 | Rajan et al. | |
| 7,955,918 B2 | 6/2011 | Wu et al. | |
| 7,960,756 B2 | 6/2011 | Sheppard et al. | |
| 7,985,986 B2 | 7/2011 | Heikman et al. | |
| 8,049,252 B2 | 11/2011 | Smith et al. | |
| 8,237,198 B2 * | 8/2012 | Wu et al. | 257/194 |
| 2001/0032999 A1 | 10/2001 | Yoshida | |
| 2001/0040247 A1 | 11/2001 | Ando et al. | |
| 2002/0036287 A1 | 3/2002 | Yu et al. | |
| 2002/0121648 A1 | 9/2002 | Hsu et al. | |
| 2002/0167023 A1 | 11/2002 | Chavarkar et al. | |
| 2003/0006437 A1 | 1/2003 | Mizuta et al. | |
| 2003/0020092 A1 | 1/2003 | Parikh et al. | |
| 2004/0041169 A1 | 3/2004 | Ren et al. | |
| 2004/0061129 A1 | 4/2004 | Saxler et al. | |
| 2004/0164347 A1 | 8/2004 | Zhao et al. | |
| 2005/0077541 A1 | 4/2005 | Shen et al. | |
| 2005/0133816 A1 | 6/2005 | Fan et al. | |
| 2005/0189561 A1 | 9/2005 | Kinzer et al. | |
| 2005/0189562 A1 | 9/2005 | Kinzer et al. | |
| 2005/0194612 A1 | 9/2005 | Beach | |
| 2005/0253168 A1 | 11/2005 | Wu et al. | |
| 2006/0011915 A1 | 1/2006 | Saito et al. | |
| 2006/0043499 A1 | 3/2006 | De Cremoux et al. | |
| 2006/0060871 A1 | 3/2006 | Beach | |
| 2006/0102929 A1 | 5/2006 | Okamoto et al. | |
| 2006/0108602 A1 | 5/2006 | Tanimoto | |
| 2006/0108605 A1 * | 5/2006 | Yanagihara et al. | 257/199 |
| 2006/0121682 A1 | 6/2006 | Saxler | |
| 2006/0124962 A1 | 6/2006 | Ueda et al. | |
| 2006/0157729 A1 | 7/2006 | Ueno et al. | |
| 2006/0186422 A1 | 8/2006 | Gaska et al. | |
| 2006/0189109 A1 | 8/2006 | Fitzgerald | |
| 2006/0202272 A1 | 9/2006 | Wu et al. | |
| 2006/0220063 A1 | 10/2006 | Kurachi et al. | |
| 2006/0255364 A1 | 11/2006 | Saxler et al. | |
| 2006/0289901 A1 | 12/2006 | Sheppard et al. | |
| 2007/0007547 A1 | 1/2007 | Beach | |
| 2007/0018187 A1 | 1/2007 | Lee et al. | |
| 2007/0018199 A1 | 1/2007 | Sheppard et al. | |
| 2007/0018210 A1 | 1/2007 | Sheppard | |
| 2007/0045670 A1 | 3/2007 | Kuraguchi | |
| 2007/0080672 A1 | 4/2007 | Yang | |
| 2007/0128743 A1 | 6/2007 | Huang et al. | |
| 2007/0132037 A1 | 6/2007 | Hoshi et al. | |
| 2007/0134834 A1 | 6/2007 | Lee et al. | |
| 2007/0145390 A1 * | 6/2007 | Kuraguchi | 257/94 |
| 2007/0158692 A1 | 7/2007 | Nakayama et al. | |
| 2007/0164315 A1 | 7/2007 | Smith et al. | |
| 2007/0164322 A1 | 7/2007 | Smith et al. | |
| 2007/0194354 A1 | 8/2007 | Wu et al. | |
| 2007/0205433 A1 | 9/2007 | Parikh et al. | |
| 2007/0210329 A1 * | 9/2007 | Goto | 257/147 |
| 2007/0224710 A1 | 9/2007 | Palacios et al. | |
| 2007/0228477 A1 | 10/2007 | Suzuki et al. | |
| 2007/0278518 A1 | 12/2007 | Chen et al. | |
| 2008/0073670 A1 | 3/2008 | Yang et al. | |
| 2008/0093626 A1 | 4/2008 | Kuraguchi | |

(56) References Cited

U.S. PATENT DOCUMENTS

| | | | |
|---|---|---|---|
| 2008/0121876 A1* | 5/2008 | Otsuka et al. | 257/40 |
| 2008/0157121 A1 | 7/2008 | Ohki | |
| 2008/0203430 A1 | 8/2008 | Simin et al. | |
| 2008/0230784 A1 | 9/2008 | Murphy | |
| 2008/0237606 A1 | 10/2008 | Kikkawa et al. | |
| 2008/0237640 A1 | 10/2008 | Mishra et al. | |
| 2008/0274574 A1 | 11/2008 | Yun | |
| 2008/0283844 A1 | 11/2008 | Hoshi et al. | |
| 2008/0308813 A1 | 12/2008 | Suh et al. | |
| 2009/0032820 A1 | 2/2009 | Chen | |
| 2009/0032879 A1* | 2/2009 | Kuraguchi | 257/368 |
| 2009/0045438 A1 | 2/2009 | Inoue et al. | |
| 2009/0050936 A1* | 2/2009 | Oka | 257/192 |
| 2009/0065810 A1 | 3/2009 | Honea et al. | |
| 2009/0072240 A1 | 3/2009 | Suh et al. | |
| 2009/0072269 A1 | 3/2009 | Suh et al. | |
| 2009/0072272 A1 | 3/2009 | Suh et al. | |
| 2009/0075455 A1 | 3/2009 | Mishra | |
| 2009/0085065 A1 | 4/2009 | Mishra et al. | |
| 2009/0146185 A1 | 6/2009 | Suh et al. | |
| 2009/0201072 A1 | 8/2009 | Honea et al. | |
| 2009/0218598 A1* | 9/2009 | Goto | 257/192 |
| 2009/0267078 A1 | 10/2009 | Mishra et al. | |
| 2010/0067275 A1 | 3/2010 | Wang et al. | |
| 2010/0264461 A1 | 10/2010 | Rajan et al. | |
| 2011/0006346 A1 | 1/2011 | Ando et al. | |
| 2011/0012110 A1 | 1/2011 | Sazawa et al. | |

FOREIGN PATENT DOCUMENTS

| | | |
|---|---|---|
| CN | 102017160 A | 4/2011 |
| EP | 1 998 376 | 12/2008 |
| EP | 2 188 842 | 5/2010 |
| JP | 2000-058871 | 2/2000 |
| JP | 2003-229566 | 8/2003 |
| JP | 2003-244943 | 8/2003 |
| JP | 2004-260114 A | 9/2004 |
| JP | 2006-32749 A | 2/2006 |
| JP | 2006-033723 A | 2/2006 |
| JP | 2007-036218 A | 2/2007 |
| JP | 2007-215331 | 8/2007 |
| JP | 2008-199771 | 8/2008 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010-039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |

OTHER PUBLICATIONS

Arulkumaran, et al., "Surface passivation effects on AlGaN/GaN high-electron-mobility transistors with $SiO_2$, $Si_3N_4$, and silicon oxynitride," Applied Physics Letters, 2004, (84(4):613-615.

Ando, et al., "10-W/mm AlGaN-GaN HFET with a field modulating plate," IEEE Electron Device Letters, 2003, 24(5):289-291.

Authorized officer Chung Keun Lee, International Search Report and Written Opinion in PCT/US2008/076079, mailed Mar. 20, 2009, 11 pages.

Authorized officer Nora Lindner, International Preliminary Report on Patentability in PCT/US2008/076079, mailed Apr. 1, 2010, 6 pages.

Authorized officer Keon Hyeong Kim, International Search Report and Written Opinion in PCT/US2008/076160, mailed Mar. 18, 2009, 11 pages.

Authorized officer Chung Keun Lee, International Search Report and Written Opinion in PCT/US2008/076199, mailed Mar. 24, 2009, 11 pages.

Authorized officer Dorothée Mülhausen, International Preliminary Report on Patentability in PCT/US2008/076199, mailed Apr. 1, 2010, 6 pages.

Authorized officer Keon Hyeong Kim, International Search Report and Written Opinion in PCT/US2008/085031, mailed Jun. 24, 2009, 11 pages.

Authorized officer Yolaine Cussac, International Preliminary Report on Patentability in PCT/US2008/085031, mailed Jun. 24, 2010, 6 pages.

Authorized officer Tae Hoon Kim, International Search Report and Written Opinion in PCT/US2009/041304, mailed Dec. 18, 2009, 13 pages.

Authorized officer Dorothée Mülhausen, International Preliminary Report on Patentability in PCT/US2009/041304, mailed Nov. 4, 2010, 8 pages.

Authorized officer Sung Hee Kim, International Search Report and Written Opinion in PCT/US2009/057554, mailed May 10, 2010, 13 pages.

Authorized officer Gijsbertus Beijer, International Preliminary Report on Patentability in PCT/US2009/057554, mailed Apr. 7, 2011, 7 pages.

Authorized officer Cheon Whan Cho, International Search Report and Written Opinion in PCT/US2009/066647, mailed Jul. 1, 2010, 16 pages.

Authorized officer Athina Nikitas-Etienne, International Preliminary Report on Patentability in PCT/US2009/066647, mailed Jun. 23, 2011, 12 pages.

Authorized officer Chung Keun Lee, International Search Report and Written Opinion in PCT/US2009/076030, mailed Mar. 23, 2009, 10 pages.

Authorized officer Yolaine Cussac, International Preliminary Report on Patentability in PCT/US2009/076030, mailed Mar. 25, 2010, 5 pages.

Authorized officer Sung Chan Chung, International Search Report and Written Opinion in PCT/US2010/021824, mailed Aug. 23, 2010, 9 pages.

Authorized officer Sang Ho Lee, International Search Report and Written Opinion in PCT/US2010/034579, mailed Dec. 24, 2010, 9 pages.

Authorized officer Sang Ho Lee, International Preliminary Report on Patentability in PCT/US2010/034579, mailed Nov. 24, 2011, 7 pages.

Authorized officer Jeongmin Choi, International Search Report and Written Opinion in PCT/US2010046193, mailed Apr. 26, 2011, 13 pages.

Authorized officer Sang Ho Lee, International Search Report and Written Opinion in PCT/US2010/059486, mailed Jul. 26, 2011, 9 pages.

Barnett and Shinn, "Plastic and elastic properties of compositionally modulated thin films," Annu. Rev. Mater. Sci., 1994, 24:481-511.

Chen, et al., "High-performance AlGaN/GaN lateral field-effect rectifiers compatible with high electron mobility transistors," Jun. 25, 2008, Applied Physics Letters, 92:253501-1-3.

Cheng, et al., "Flat GaN epitaxial layers grown on Si(111) by metalorganic vapor phase epitaxy using step-graded AlGaN intermediate layers," Journal of Electronic Materials, 2006, 35(4):592-598.

Chu, et al., "1200-V normally off GaN-on-Si field-effect transistors with low dynamic on-resistance," IEEE Electron Device Letters, May 2001) 32(5):632-634.

(56) References Cited

OTHER PUBLICATIONS

Coffie, R.L., "Characterizing and suppressing DC-to-RF dispersion in AlGaN/GaN high electron mobility transistors," 2003, PhD Thesis, University of California, Santa Barbara, 169 pp.
Coffie et al. (2003), "Unpassivated p-GaN/AlGaN/GaN HEMTs with 7.1 W/mm at 10 GhZ," Electronic Letters, 39(19):1419-1420.
Dora, et al., "High breakdown voltage achieved on AlGaN/GaN HEMTs with integrated slant field plates," Sep. 9, 2006, IEEE Electron Device Letters, 27(9):713-715.
Dora, Y., "Understanding material and process limits for high breakdown voltage AlGaN/GaN HEMTs," Dissertation, University of California, Santa Barbara, Mar. 2006, 157 pp.
Dora, et al., "$ZrO_2$ gate dielectrics produced by ultraviolet ozone oxidation for GaN and AlGaN/GaN transistors," Mar./Apr. 2006, J. Vac. Sci. Technol. B, 24(2):575-581.
Fanciulli, et al., "Structural and electrical properties of $HfO_2$ films grown by atomic layer deposition on Si, Ge, GaAs and GaN," 2004, Mat. Res. Soc. Symp. Proc., vol. 786, 6 pp.
Green, et al., "The effect of surface passivation on the microwave characteristics of undoped AlGaN/GaN HEMT's," IEEE Electron Device Letters, Jun. 2000, 21(6):268-270.
Gu, et al., "AlGaN/GaN MOS transistors using crystalline $ZrO_2$ as gate dielectric," 2007, Proceedings of SPIE, 6473:64730S-1-8.
Higashiwaki, et al. "AlGaN/GaN heterostructure field-effect transistors on 4H-SiC substrates with current-gain cutoff frequency of 190 GHz," Applied Physics Express, 2008, 1:021103-1-3.
Hwang, et al. "Effects of a molecular beam epitaxy grown AlN passivation layer on AlGaN/GaN heterojunction field effect transistors," Solid-State Electronics, 2004 48:363-366.
Im, et al., "Normally off GaN MOSFET based on AlGaN/GaN heterostructure with extremely high 2DEG density grown on silicon substrate," IEEE Electron Device Letters, Mar. 2010, 31(3):192-194.
Karmalkar and Mishra, "Enhancement of breakdown voltage in AlGaN/GaN high electron mobility transistors using a field plate," IEEE Transactions on Electron Devices, 2001, 48(8):1515-1521.
Karmalkar and Mishra, "Very high voltage AlGaN/GaN high electron mobility transistors using a field plate deposited on a stepped insulator," Solid-State Electronics, 2001, 45:1645-1652.
Keller, et al., "GaN-GaN junctions with ultrathin AlN interlayers: expanding heterojunction design," Applied Physics Letters, 2002, 80(23):4387-4389.
Keller, et al., "Method for heteroepitaxial growth of high quality N-Face GaN, InN and AlN and their alloys by metal organic chemical vapor deposition," U.S. Appl. No. 60/866,035, filed Nov. 15, 2006, 31 pp.
Khan, et al., "AlGaN/GaN metal oxide semiconductor heterostructure field effect transistor," IEEE Electron Device Letters, 2000, 21(2):63-65.
Kim, D.H., "Process development and device characteristics of AlGaN/GaN HEMTs for high frequency applications," Dissertation, University of Illinois at Urbana-Champaign, 2007, 120 pp.
Kumar, et al., "High transconductance enhancement-mode AlGaN/GaN HEMTs on SiC substrate," Electronics Letters, Nov. 27, 2003, 39(24):1758-1760.
Kuraguchi, et al., "Normally-off GaN-MISFET with well-controlled threshold voltage," Phys. Stats. Sol., 2007, 204(6):2010-2013.
Lanford, et al., "Recessed-gate enhancement-mode GaN HEMT with high threshold voltage," Mar. 31, 2005, Electronics Letters, vol. 41, No. 7, 2 pp.
Lee, et al., "Self-aligned process for emitter- and base-regrowth GaN HBTs and BJTs," Solid-State Electronics, 2001, 45:243-247.
Marchand, et al., "Metalorganic chemical vapor deposition of GaN on Si(111): stress control and application to field-effect transistors," Journal of Applied Physics, 2001, 89(12):7846-7851.
Mishra, et al., "AlGaN/GaN HEMTs—an overview of device operation and applications," Proceedings of the IEEE, 2002, 90(6):1022-1031.
Mishra, et al., "Growing N-polar III-nitride structures," U.S. Appl. No. 60/972,467, filed Sep. 14, 2007, 7 pp.
Mishra, et al., "Polarization-induced barriers for n-face nitride-based electronics," U.S. Appl. No. 60/940,052, filed May 24, 2007, 29 pp.
Mishra, et al., "N-face high electron mobility transistors with low buffer leakage and low parasitic resistance," U.S. Appl. No. 60/908,914, filed Mar. 29, 2007, 21 pp.
Nanjo, et al., "Remarkable breakdown voltage enhancement in AlGaN channel high electron mobility transistors," Applied Physics Letters, 2008, 92:263502-1-3.
Ota and Nozawa, "AlGaN/GaN recessed MIS-Gate HFET with high threshold-voltage normally-off operation for power electronics applications," IEEE Electron Device Letters, 2008, 29(7):668-670.
Palacios, et al., "AlGaN/GaN HEMTs with an InGaN-based Back-barrier," Device Research Conference Direst, 2005 (DRC '05) 63rd, Jun. 2005, pp. 181-182.
Palacios, et al., "AlGaN/GaN high electron mobility transistors with InGaN back-barriers," IEEE Electron Device Letters, Jan. 2006, 27(1):13-15.
Palacios, et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pp.
Palacios, et al., "Nitride-based high electron mobility transistors with a GaN spacer," Applied Physics Letters, 2006, 89:073508-1-3.
Pei, et al., "Effect of dielectric thickness on power performance of AlGaN/GaN HEMTs," IEEE Electron Device Letters, Apr. 2009, 30(4):313-315.
SITIS Topic Details, "Planar, low switching loss, gallium nitride devices for power conversion applications," SBIR/STTR Interactive Top Information System (SITIS), N121-090 (Navy), [online] [Retrieved on Jan. 6, 2012]; Retrieved from the Internet URL: http://www.dodsbir.net/sitis/display_topic.asp?Bookmark=42087[1/6/2012_2012_3:07:27_PM]; 3 pp.
Rajan, et al., "Advanced transistor structures based on N-face GaN," 32M international symposium on compound semiconductors (ISCS), Sep. 18-22, 2005, Europa-Park Rust, Germany, 2 pp.
Rajan, et al., "Method for heteroepitaxial growth of high quality N-Face GaN, InN and AlN and their alloys by metal organic chemical vapor deposition," U.S. Appl. No. 60/866,035, filed Nov. 15, 2006, 31 pp.
Reiher, et al., "Efficient stress relief in GaN heteroepitaxy on SiC (111) using low-temperature AlN interlayers," Journal of Crystal Growth, 2003, 248:563-567.
Saito, et al., "Recess-gate structure approach toward normally off high-voltage AlGaN/GaN HEMT for power electronics applications," Feb. 2006, IEEE Transactions on Electron Device, 53(2):356-362.
Shelton, et al., "Selective area growth and characterization of AlGaN/GaN heterojunction bipolar transistors by metalorganic chemical vapor deposition," IEEE Transactions on Electron Devices, 2001, 48(3):490-494.
Shen, L, "Advanced polarization-based design of AlGaN/GaN HEMTs," Jun. 2004, PhD Thesis, University of California, Santa Barbara, 191 pp.
SIPO First Office Action for Application No. 200880120050.6, Aug. 2, 2011, 8 pp.
Suh, et al., "High-breakdown enhancement-mode AlGaN/GaN HEMTs with integrated slant field-plate," Electron Devices Meeting, 2006, IEDM '06, International (2006), 3 pp.
Suh, et al., "High breakdown enhancement mode GaN-based HEMTs with integrated slant field plate," U.S. Appl. No. 60/822,886, filed Aug. 18, 2006, 16 pp.
Suh, et al., "High breakdown enhancement mode gallium nitride based high electron mobility transistors with integrated slant field plate," U.S. Appl. No. 11/841,476, filed Aug. 20, 2007, 25 pp.
Suh, et al., "III-nitride devices with recessed gates," U.S. Appl. No. 60/972,481, filed Sep. 14, 2007, 18 pp.
Sugiura, et al., "Enhancement-mode n-channel GaN MOSFETs fabricated on p-GaN using $HfO_2$ as gate oxide," Aug. 16, 2007, Electronics Letters, vol. 43, No. 17, 2 pp.
Tipirneni, et al., "Silicon dioxide-encapsulated high-voltage AlGaN/GaN HFETs for power-switching applications," IEEE Electron Device Letters, 2007, 28(9):784-786.

(56) References Cited

OTHER PUBLICATIONS

Vetury, et al., "Direct measurement of gate depletion in high breakdown (405V) Al/GaN/GaN heterostructure field effect transistors," Electron Device Meeting, 1998 (IEDM 98), Technical Digest, pp. 55-58.

Wang, et al., "Comparison of the effect of gate dielectric layer on 2DEG carrier concentration in strained AlGaN/GaN heterostructure," Mater. Res. Soc. Symp. Proc., 2005, 831:E8.20.1-E8.20.6.

Wang, et al., "Enhancement-mode $Si_3N_4$/AlGaN/GaN MISHFETs," IEEE Electron Device Letters, 2006, 27(10):793-795.

Wu, et al., "97.8% efficient GaN HEMT boost converter with 300-W output power at 1 MHz," IEEE Electron Device Letters, 2008, 29(8):824-826.

Wu, Y. "'AlGaN/GaN microwave power high-mobility transistors," Dissertation, University of California, Santa Barbara, Jul. 1997, 134 pp.

Yoshida, S., "AlGan/GaN power FET," Furukawa Review, 2002, 21:7-11.

Zhang, N., "High voltage GaN HEMTs with low on-resistance for switching applications," Dissertation, University of California, Santa Barbara, Sep. 2002, 166 pp.

Authorized officer Simin Baharlou, International Preliminary Report on Patentability in PCT/US2008/076160, mailed Mar. 25, 2010, 6 pages.

Authorized officer Beate Giffo-Schmitt, International Preliminary Report on Patentability in PCT/US2010/021824, mailed Aug. 18, 2011, 6 pages.

Authorized officer Philippe Bécamel, International Preliminary Report on Patentability in PCT/US2010/046193, mailed Mar. 8, 2012, 10 pages.

Authorized officer Nora Lindner, International Preliminary Report on Patentability in PCT/US2010/059486, mailed Jun. 21, 2012, 6 pages.

Taiwan Search Report and Action in Application No. 098141930, mailed Jul. 10, 2014, 7 pages.

\* cited by examiner (b)

(a)

SEMICONDUCTOR HETEROSTRUCTURE DIODES

CROSS-REFERENCE TO RELATED APPLICATIONS

This application is a continuation of U.S. application Ser. No. 13/533,339, filed on Jun. 26, 2012 (now U.S. Pat. No. 8,541,818), which is a divisional of U.S. application Ser. No. 13/008,874, filed on Jan. 18, 2011 (now U.S. Pat. No. 8,237, 198), which is a divisional of U.S. application Ser. No. 12/332,284, filed on Dec. 10, 2008 (now U.S. Pat. No. 7,898, 004). The disclosures of the prior applications are considered part of and are incorporated by reference in the disclosure of this application.

TECHNICAL FIELD

This invention relates to semiconductor electronic devices, specifically Schottky diodes based on semiconductor heterojunctions.

BACKGROUND

Diodes are used in a wide range of electronic circuits. Diodes used in circuits for high voltage switching applications ideally require the following characteristics. When biased in the reverse direction (i.e., the cathode is at a higher voltage than the anode), the diode should be able to support a large voltage while allowing as little current as possible to pass through. The amount of voltage that must be supported depends on the application; for example, many high power switching applications require diodes that can support a reverse bias of at least 600V or at least 1200V without passing a substantial amount of current. When current flows through the diode in the forward direction (from anode to cathode), the forward voltage drop across the diode $V_{on}$ should be as small as possible to minimize conduction losses, or in other words the diode on-resistance $R_{on}$ should be as small as possible. Finally, the amount of charge stored in the diode when it is reverse biased should be as small as possible to reduce transient currents in the circuit when the voltage across the diode changes, thereby reducing switching losses.

In diodes, there is typically a trade-off between the various characteristics described above. For example, Silicon Schottky diodes can typically exhibit excellent switching speed and on-state performance but suffer from large reverse leakage currents, making them unsuitable for high voltage applications. Conversely, high voltage Si PIN diodes can support large reverse bias voltages with low leakage but typically exhibit high conduction and switching losses. Further, reverse recovery currents in PIN diodes add to transistor losses in circuits.

Illustrations of typical Schottky diodes are show in FIGS. 1 and 2. FIG. 1 shows a vertical diode structure. Layers 2 and 4 are comprised of a semiconductor material of the same conductivity type, wherein layer 2 is heavily doped and layer 4 is lightly doped. Metal layer 7 forms a Schottky anode contact to layer 4, and metal layer 8 forms an ohmic cathode contact to layer 2. Increasing the active device area and/or decreasing the thickness of semiconductor layer 4 reduces the forward operating voltage $V_{on}$ but increases reverse-bias leakage.

FIGS. 2a and 2b show a lateral diode structure, wherein FIG. 2a is a cross-sectional view and FIG. 2b is a plan view (top view) of the diode structure. Layers 12 and 14 are comprised of a semiconductor material of the same conductivity type (i.e., they are either both n-type or both p-type), wherein layer 12 is heavily doped and layer 14 is lightly doped. Metal layer 17 forms a Schottky contact to layer 14, and metal layer 18 forms an ohmic contact to layer 2. This geometry can be preferable to a vertical one when a planar structure for the anode and cathode is required for packaging, or when the semiconductor material is epitaxially grown on an insulating substrate. The on-resistance $R_{on}$ for the lateral geometry is typically larger than that for the vertical geometry due to the added lateral resistance of region 19 through which the forward current must travel. Additionally, as a result of the forward current flowing laterally outwards through a layer 12 with non-zero sheet resistance, the current through 14 tends to crowd towards the edges of the mesa, thereby further increasing the on-resistance.

In standard Schottky diodes, Schottky barrier lowering occurs when the diode is reverse biased, resulting in increased reverse bias currents. Schottky barrier lowering for the diode in FIG. 1 is illustrated schematically in the diagrams of FIGS. 3a and 3b. FIGS. 3a and 3b are band diagrams along dotted line 117 in FIG. 1, where FIG. 3a corresponds to zero applied bias, i.e. anode contact 7 and cathode contact 8 are at the same voltage, and FIG. 3b is for a reverse bias $V_R$, i.e. anode contact 7 is at a lower voltage than the cathode contact 8. The electric field in the structure is proportional to the slope of the conduction band $E_C$ in FIGS. 3a and 3b. The Schottky barrier height in FIG. 3b, $(\Phi_B)_R$, is less than that in FIG. 3a, $(\Phi_B)_0$, by an amount $\Delta\Phi_B$, where $\Delta\Phi_B$ increases as the maximum electric field near the metal-semiconductor junction increases, which occurs when $V_R$ is increased. This lowering of the Schottky barrier results in increased reverse bias currents as the reverse voltage across the device is increased.

It is desirable to provide diodes for which high blocking voltages can be achieved while at the same time maintaining lower on-resistances. Diode structures which can easily be integrated with other circuit components, such as transistors, are desirable for process integration and cost reduction. Additionally, Schottky diodes for which Schottky barrier lowering is mitigated are desirable, since lower reverse leakage currents can potentially be achieved.

SUMMARY

Semiconductor Schottky diodes with low on-resistance, high breakdown voltage, and low reverse leakage currents are described. Devices described herein include a two-dimensional electron gas (2DEG) to reduce on-resistance and conduction losses and can include one or more of the following features. A diode can include a field plate or multiple field plates to increase the breakdown voltage. A diode can include a Schottky barrier which is not lowered during reverse bias operation. A diode can be integrated with a semiconductor transistor on the same substrate.

In one aspect, a diode is described. The diode includes a first III-N material layer, a second III-N material layer and two terminals. The second III-N material layer is on the first III-N material layer, wherein a 2DEG channel is in the first III-N material layer because of a compositional difference between the first III-N material layer and the second III-N material layer. A first terminal is an anode consisting of a Schottky contact formed with the second III-N material layer and a second terminal is a single cathode in ohmic contact with the 2DEG channel.

In another aspect, a diode is described. The diode includes a first III-N material layer, a second III-N material layer, a third III-N material layer, a fourth III-N material layer and two terminals. The second III-N material layer is on the first III-N material layer. The second III-N material layer differs in composition from the first III-N layer. The third III-N material layer is on the second III-N material layer and differs in composition from the second III-N material layer. The fourth III-N material layer is on the third III-N material layer. A 2DEG channel is induced in the third III-N material layer adjacent to the fourth III-N material layer because of a compositional difference between the third III-N material layer and the fourth III-N material layer. A first terminal is an anode consisting of a Schottky contact with the fourth III-N material layer and a second terminal is a single cathode in ohmic contact with the 2DEG channel.

In yet another aspect, a diode is described that includes a first III-N material layer, a second III-N material layer, an anode and a single cathode. The second III-N material layer is compositionally graded and has a channel consisting of a polarization-induced charge distribution. The anode consists of a Schottky contact with the second III-N material layer. The cathode is in ohmic contact with the channel.

In another aspect, a diode is described that includes a substrate, a first III-N material layer on the substrate, a second III-N material layer on the first III-N material layer, wherein the second III-N material layer is compositionally different from the first III-N material layer, a third III-N material layer on the second III-N material layer and two terminals. A 2DEG channel is in the second III-V material layer adjacent to the first III-V material layer because of a compositional difference between the first III-N material layer and the second III-N material layer and the first, second, and third III-N material layers are N-polar or nitrogen-terminated semi-polar material. One terminal is an anode consisting of a Schottky contact with an N-face of the third III-N material layer and one terminal is a single cathode in ohmic contact with the 2DEG channel.

In yet another aspect, a diode is described that includes a first III-N material layer, a second III-N material layer on the first III-N material layer, a first insulator layer on the first III-N material layer so that the second III-N material layer is between the first insulator layer and the first III-N material layer and two terminals. The second III-N material layer has a thickness and a first 2DEG channel is in the first III-N material layer because of a compositional difference between the first III-N material layer and the second III-N material layer. The insulator layer is less than 7 nm thick. The first terminal is an anode that extends through an entirety of the thickness of the second III-N material layer to contact the first III-N material layer and form a Schottky contact with the first III-N material layer and has extending portions that extend over the first insulator layer and a second terminal is a single cathode in ohmic contact with the first 2DEG channel.

In another aspect a diode is described that includes a first III-N material layer, a second III-N material layer on the first III-N material layer, a third III-N material layer, a fourth III-N material layer and two terminals. The second III-N material layer has a thickness and a first 2DEG channel is in the first III-N material layer because of a compositional difference between the first III-N material layer and the second III-N material layer. The second III-N material layer is between the first III-N material layer and the third III-N material layer. The third III-N material layer is between the fourth III-N material layer and the second III-N material layer and a second 2DEG is in the third III-N material layer because of a compositional difference between the third III-N material layer and the fourth III-N material layer. A first terminal is an anode that extends through an entirety of the thickness of the second III-N material layer to contact the first III-N material layer and form a Schottky contact with the first III-N material layer and has extending portions that extend over the first insulator layer and a second terminal is a single cathode in ohmic contact with the first 2DEG channel.

In another aspect, a diode is described that includes a first III-N material layer, a second III-N material layer, wherein the second III-N material layer has a thickness and is compositionally graded and has a channel consisting of a polarization-induced charge distribution, an anode forming a Schottky contact with the second III-N material layer, wherein the anode extends through an entirety of the thickness of the second III-N material layer and has extending portions that extend over the second III-N material layer and a single cathode in ohmic contact with the channel.

In yet another aspect, a diode is described that includes a III-N semiconductor material, an anode Schottky contact, and a cathode contact, wherein a Schottky barrier height of the anode contact is not substantially reduced when the diode is reverse biased as compared to when the anode and cathode contacts are at the same voltage.

Embodiments may include one or more of the following features. When the diode is forward biased, current can flow from the anode to the cathode predominantly through a Schottky barrier and the 2DEG channel. The first III-N material layer can include GaN. The second III-N material layer can be recessed in a location corresponding to the anode. A field plate can be electrically connected to the anode. An insulating layer can surround the anode and be between the field plate and the second III-N material layer. The second III-N material layer can include a recess in which a backside electrically conductive layer electrically contacts the cathode. A region of the second III-N material layer can be n-type, the region contacting the cathode and the conductive layer. A third III-N material layer can be on a side of the second III-N material layer opposite to the first III-N material layer and an insulator layer can be on the third III-N material layer opposite to the second III-N material layer, wherein the third III-N material layer is at least five times thicker than the second III-N material layer and is doped, and the anode is in a recess in the third III-N material layer and the insulator layer. A second 2DEG channel can be induced in the first III-N material layer adjacent to the second III-N material layer. Grading in a layer can induce n-type conductivity. An entirety of the second III-N material layer can be graded. The first III-N material layer and second III-nitride material layer can be oriented in a polar direction. The layers can be oriented in a [0 0 0 1] polar direction. The first III-N material layer and the second III-N material layer can be oriented in a semi-polar direction. The semi-polar direction can be a gallium terminated semi-polar direction. The second III-N material layer can be $Al_xGa_{1-x}N$, where x changes from about 0 to less than 0.3 from a portion of the layer adjacent to the first III-N material layer to a portion adjacent to the third III-N material layer and the third III-N material layer can either be GaN or $Al_zGa_{1-z}N$. z can be larger than the maximum value of x and a 2DEG is in the second III-N material layer. z can be less than the maximum value of x. The first III-N material layer can be doped. With some diodes, the Schottky barrier height is not substantially reduced when the diode is reverse biased. A field plate can extend from the extending portions of the anode and the second insulator layer is between the field plate and the first insulator layer. Sidewall insulating material can surround a lateral sidewall of the anode, wherein a horizontal portion of the anode contacts the first III-N material layer. One of the III-N material layer can be AlN. An insulator can be between the extending portions and the fourth III-N material layer and a sidewall insulator can be between a lateral side of the anode and the second III-N material layer, wherein a bottom side of the anode makes the Schottky contact with the first III-N material layer. An insulator layer can be on the second III-N material layer, wherein the insulator layer is between the second III-N material layer and the extending portions of the anode.

An assembly can be formed from any of the diode described herein. An assembly can also include a III-N transistor, where a terminal of the two terminals of the diode is electrically connected to a terminal of a III-N transistor. The anode of the diode can be electrically connected to a drain of the III-N transistor. The diode and the III-N transistor can be on a common substrate. An assembly can include an enhancement mode III-N transistor, wherein a terminal of the diode is electrically connected to a terminal of the III-N transistor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 4:
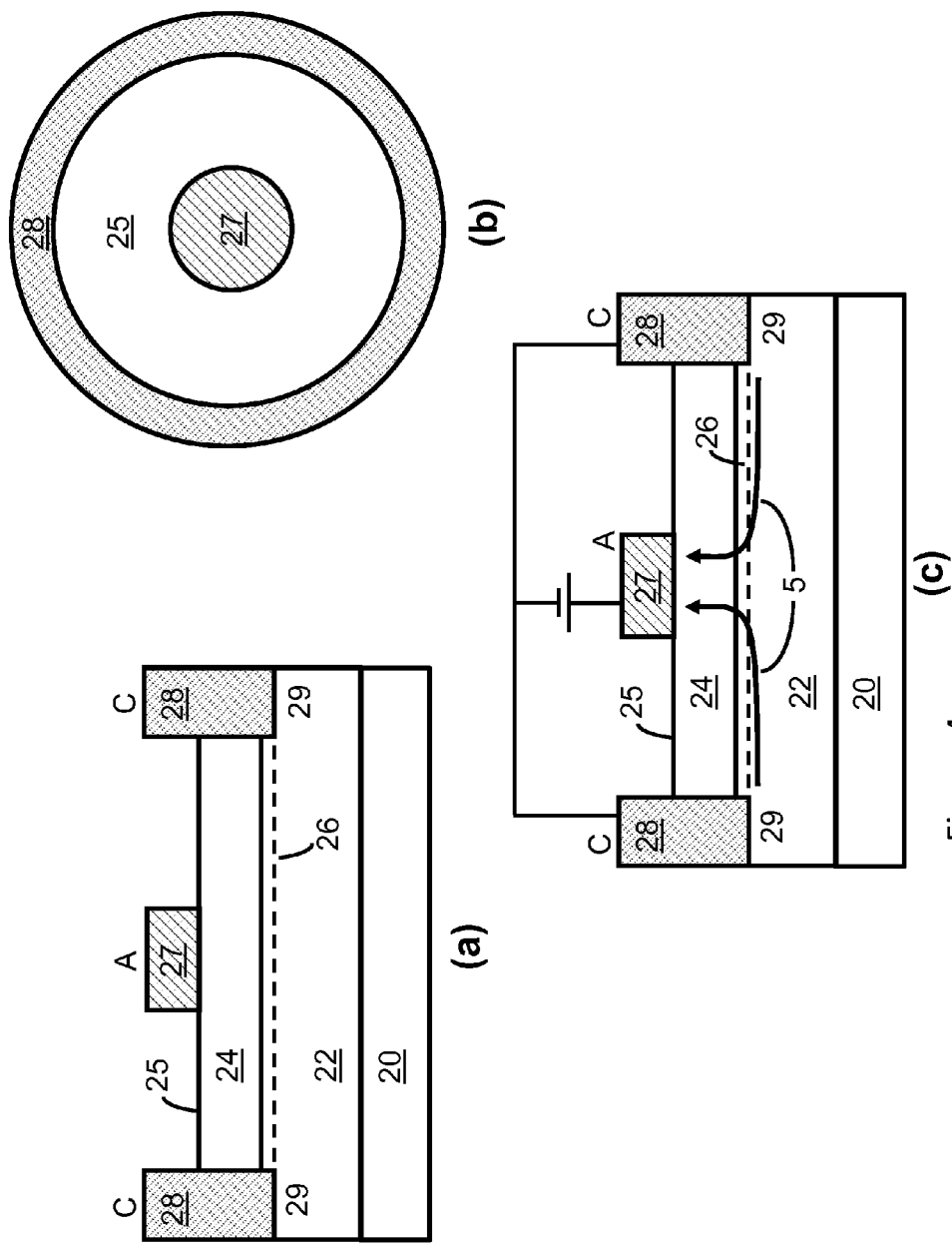
FIGS. 4a and 4b are cross-sectional and plan views, respectively, of one embodiment of a semiconductor diode.
FIG. 4c shows the path of electron flow through the device of FIG. 4a during one mode of operation.

Diodes based on semiconductor heterostructures that can support high reverse-bias voltages while at the same time exhibit low on-resistance $R_{on}$ as well as low switching losses are described. An embodiment of this invention is shown in FIGS. 4a and 4b, wherein FIG. 4a is a cross-sectional view and FIG. 4b is a plan view (top view) of this embodiment. Briefly, the semiconductor device of this embodiment includes a substrate 20, a first semiconductor layer 22 on top of the substrate, and a second semiconductor layer 24 on top of the first semiconductor layer. Semiconductor layers 22 and 24 have different compositions from one another, the compositions selected such that a two-dimensional electron gas (2DEG) 26 is induced in the first semiconductor layer 22 near the interface between the first and second semiconductor layers 22 and 24. An anode contact 27 or a plurality of contacts are formed on top of surface 25 of the second semiconductor layer 24, and a single cathode contact 28 is formed which contacts the 2DEG 26 and is in close proximity to at least a portion of anode contacts 27. As used herein, the term "single cathode contact" refers to either a single metallic contact which serves as a cathode, or to a plurality of contacts serving as cathodes which are electrically connected such that the electric potential at each contact is about the same. As used herein, two or more contacts or other items are said to be "electrically connected" if they are connected by a material which is sufficiently conducting to ensure that the electric potential at each of the contacts or other items is about the same at all times. Anode and cathode contacts 27 and 28 may be any arbitrary shape, although the shape is ideally optimized to minimize the device area required for a given forward current. The anode contact 27 is a Schottky contact, and the single cathode contact 28 is an ohmic contact.

As stated earlier, semiconductor layers 22 and 24 have different compositions from one another. The compositions are selected such that the second semiconductor layer 24 has a larger bandgap than the first semiconductor layer 22, which helps enable the formation of 2DEG 26. The polarization fields, including both spontaneous and piezoelectric polarization, in semiconductor layers 22 and 24 can be different from one another and can contribute to inducing the 2DEG 26. If semiconductor layers 22 and 24 are composed of non-polar semiconducting material, then doping all or part of the second semiconductor layer 24 with an n-type impurity may also be required to induce the 2DEG. If at least one of semiconductor layers 22 and 24 is composed of a polar semiconducting material, and the polarization field in at least one of these layers has a component in a direction normal to surface 25, then 2DEG 26 may be induced by the polarization fields without the need for any substantial doping of either of the semiconductor layers, although the 2DEG sheet charge concentration can be increased by doping all or part of the second semiconductor layer 24 with an n-type impurity.

Figure 5:
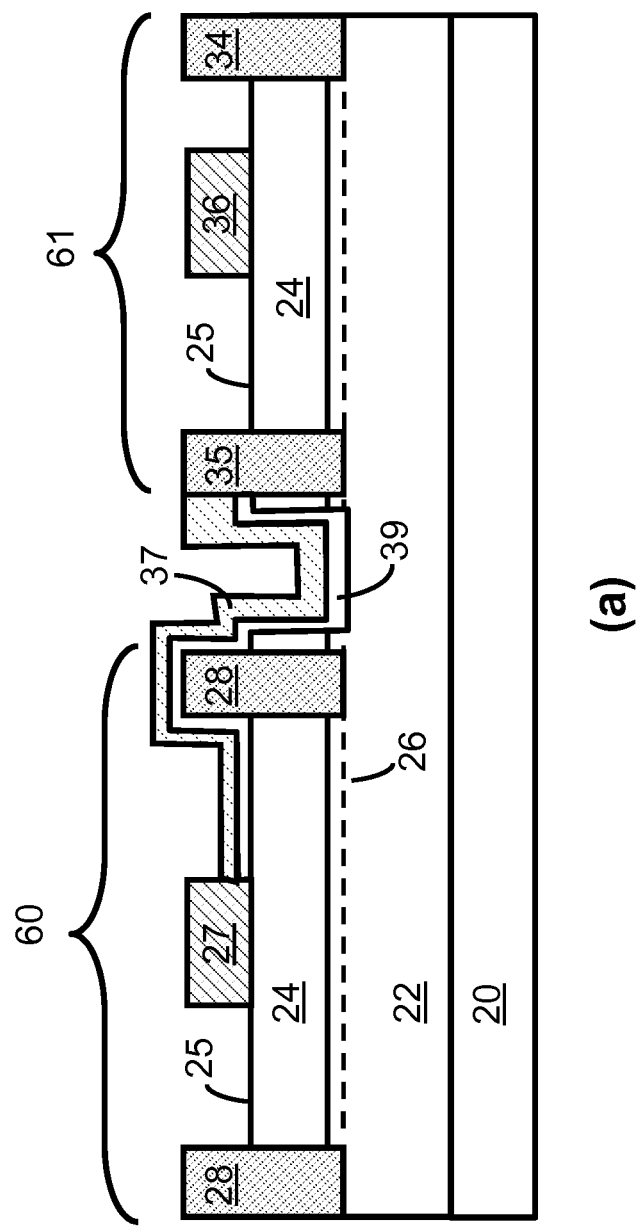
FIGS. 5a and 5b are cross-section and plan views, respectively, of the device in FIG. 4 integrated in series with a HEMT device.
FIG. 5c is a circuit schematic for the layout in FIGS. 5a and 5b.
Figure 5:
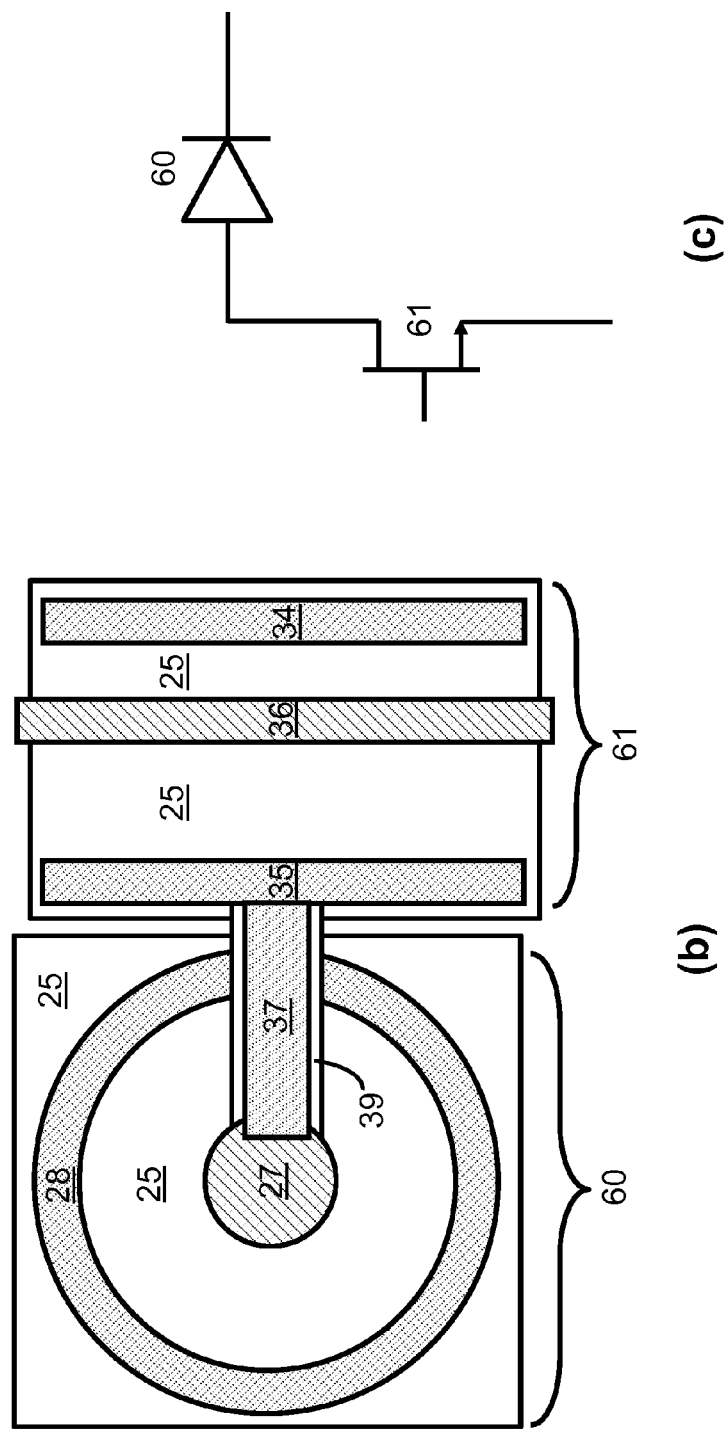

III-V semiconductor materials can be used for layers 22 and 24, wherein the compositions of the III-V layers are chosen such that the requirements for layers 22 and 24 are satisfied. High-electron mobility transistor (HEMT) devices can utilize a similar set of semiconductor materials to induce a 2DEG channel in said devices. As an example, semiconductor layer 22 can be GaN and layer 24 AlGaN, wherein layer 24 can be n-doped or can contain no significant concentration of doping impurities. In the case that layer 24 is undoped, the induced 2DEG results from the difference in polarization fields between layers 22 and 24. Since the semiconductor material configuration for the diodes described herein can be the same as that for HEMT devices that can be used in the same circuits, the diodes and HEMT devices can be integrated onto a single chip, as seen for example in FIGS. 5a and 5b, thereby simplifying the fabrication process and reducing cost.

Substrate 20 can be any suitable substrate upon which semiconductor layers 22 and 24 can be formed. In some embodiments, a buffer layer is included between substrate 20 and semiconductor layer 22 to minimize material defects in layers 22 and 24. Anode contact 27, formed upon surface 25 of layer 24, forms a Schottky contact to layer 24. Cathode contact 28 contacts the 2DEG in ohmic region 29, forming a contact which is a substantially ohmic contact. Cathode contact 28 can be made to contact the 2DEG in a number of ways. For example, a metal or combination of metals can be deposited in ohmic region 29 upon surface 25 of layer 24, followed by a thermal anneal which results in the deposited metal forming a metallic alloy with the underlying semiconductor material. Other methods by which the 2DEG can be contacted include but are not limited to ion implantation of n-type dopants into ohmic region 29, followed by a metal deposition atop this region, or by etching away the material in ohmic region 29 and regrowing n-type material, followed by a metal deposition atop this region.

The diode in FIG. 4a operates as follows. When the voltage at the anode contact 27 is less than that at the cathode contact 28, such that the Schottky junction between anode contact 27 and III-V layer 24 is reverse biased, the diode is in the OFF state with no substantial current flowing between the anode and cathode. When the voltage at the anode contact 27 is greater than that at the cathode contact 28, as shown in FIG. 4c, the Schottky junction between anode contact 27 and III-V layer 24 is forward biased, and the diode is in the ON state. Electrons 5 flow from the cathode contact 28 predominantly through the 2DEG 26 and then through the forward biased Schottky junction into the anode contact 27. That is, at least 99% of the total forward bias current flows from the anode to the cathode through the Schottky barrier and through the 2DEG channel. A small amount of leakage current can flow through other paths, such as along the surface of the device.

FIGS. 5a and 5b show a cross-sectional and plan view, respectively, of a diode 60 of the embodiment in FIG. 4a connected in series with a HEMT 61 integrated on the same chip. The HEMT 60 includes source and drain ohmic contacts 34 and 35, respectively, and gate contact 36. The HEMT can optionally include gate insulators, gate recesses, field plates, passivation layers, and other features well known in the art. The diode is connected to the HEMT by an interconnect 37, which can be isolated from the semiconductor by including an insulator 39 between the semiconductor surface and the interconnect. In general, the interconnects connect either of the two diode terminals to any of the three HEMT terminals. The circuit schematic for the layout of FIGS. 5a and 5b is shown in FIG. 5c.

As used herein, the term "III-Nitride material" or "III-N material" refers to a compound semiconductor material according to the stoichiometric formula $Al_xIn_yGa_zN$, where $x+y+z$ is about 1. For high voltage switching applications, III-Nitride (III-N) semiconductor materials are desirable for Schottky diodes due to their wide bandgap, which enables formation of devices with large breakdown voltages, as well as due to their high mobilities, which results in low on-resistance. Additionally, making use of III-N heterostructures (i.e. structures that contain at least two III-N materials with different group III compositions) that form a 2DEG to design Schottky diodes is advantageous because the 2DEG has a much higher electron mobility than that of bulk III-N material, thereby resulting in a lower sheet resistance of the conduction path in semiconductor layer 22 than can be obtained with bulk III-N material, which results in a lower on-resistance for the diode.

In the device of FIG. 4a, when III-N materials are used for semiconductor layers 22 and 24, substrate 20 can be GaN, AlN, SiC, sapphire, Si, or any other suitable substrate upon which III-N devices can be formed. III-N layers 22 and 24 are oriented in the [0 0 0 1] (C-plane) direction, but can also be oriented in a semi-polar direction and terminated by a group III element. Or, layers 22 and 24 can be oriented in a non-polar direction, such as the m-plane direction, in which case part or all of layer 24 is doped with an n-type impurity to induce the 2DEG. The compositions of III-N layers 22 and 24 are selected from the group consisting of the nitrides of gallium, indium and aluminum, and combinations thereof. However, the relative amounts of gallium, indium, and aluminum in layers 22 and 24 are different and are chosen such that the bandgap of layer 24 is larger than that of layer 22. The polarization fields in the two layers act to induce the 2DEG 26 in layer 22. As compared to GaN, $Al_aGa_{1-a}N$ has a larger bandgap and $In_bGa_{1-b}N$ has a smaller bandgap. In general for III-N materials, increasing the Al composition results in a larger bandgap, and increasing the In composition results in a smaller bandgap. As an example, III-N layers 22 and 24 can be GaN and $Al_aGa_{1-a}N$, respectively, where 'a' is between 1 and a finite value greater than zero, such as between about 0 and 0.3, for example between about 0.15 and 0.2. Or, as another example, III-N layers 22 and 24 can be $In_bGa_{1-b}N$ and GaN, respectively, where 'b' is between 1 and a finite value greater than zero such as between about 0 and 0.2.

Using metals with different work functions for anode contact 27 allows the Schottky barrier height to be adjusted. Examples of metals that can be used include but are not limited to Ti, Cr, NiCr, Ni, Ge, Pt, and Cu. Additionally, adjusting the composition of the upper semiconductor layer 24 not only changes the bandgap but also the semiconductor work function of this layer, thereby allowing for a second method of adjusting the Schottky barrier height. Increasing the bandgap of the upper semiconductor layer 24 also tends to increase the electron concentration in the 2DEG, which tends to reduce the diode on-resistance but can also decrease the reverse-bias breakdown voltage. Thus, an optimal value for the on-resistance can be achieved by adjusting the bandgap of layer 24 to a value resulting in the minimum breakdown voltage that can be tolerated in the particular application for which the diode is being used. Additionally, all or part of semiconductor layer 22 can be doped n-type. Doping also decreases the device on-resistance, again at the expense of potentially reducing the reverse-bias breakdown voltage, but the Schottky barrier height is unaffected.

More embodiments of this invention, shown in FIGS. 6-15, include features such as field plates, back-side cathode contacts, recessed material underneath the anode Schottky contact, additional semiconductor layers, compositionally graded semiconductor layers, and integrated semiconductor devices, such as transistors, on the same chip. These features can be used independently or in combination with one another. Additionally, features which were optionally included in the device shown in FIG. 4a, such as n-type doping of one or more of the semiconductor layers, use of a semiconductor buffer layer, and adjusted Schottky barrier height obtained by varying the composition of the anode metal or the semiconductor material which the anode metal contacts, can also be included in these embodiments.

Figure 6:
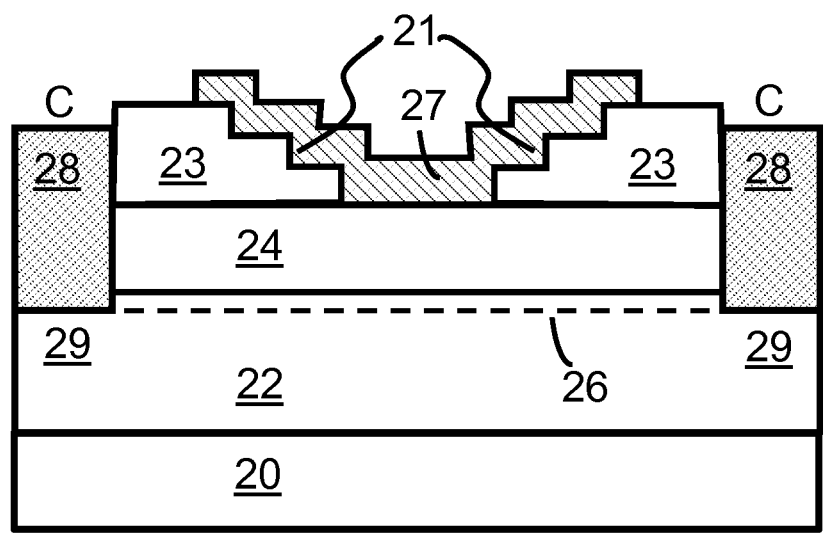
FIG. 6 is a cross-sectional view of an embodiment of a semiconductor diode.
Figure 7:
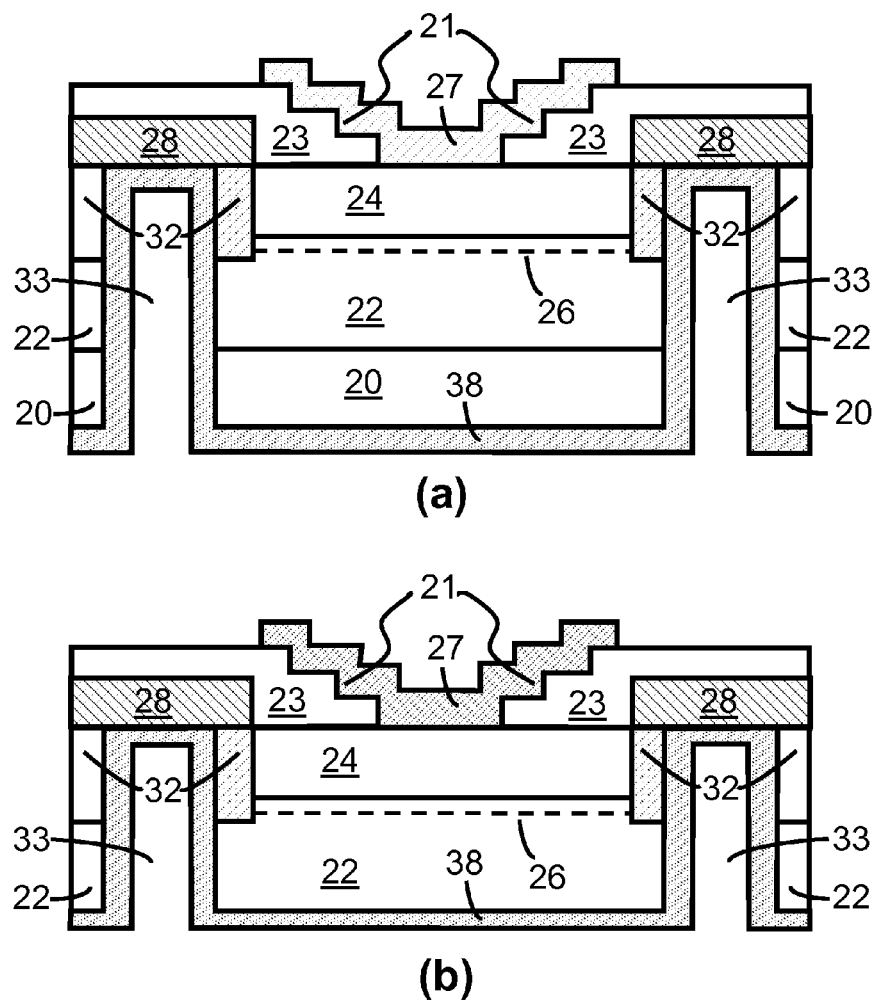
FIGS. 7a and 7b are cross-sectional views of other embodiments of semiconductor diodes.

The device in FIG. 6 is similar to that of FIG. 4a, but here the diode also includes a field plate 21 with the anode contact. The same numbers in FIGS. 4a and 6 correspond to the same layers. Layer 23 in FIG. 6 is an insulator, such as SiN. The field plate 21 in this diode reduces the peak electric field at the edge of the anode, thereby increasing the reverse-bias breakdown voltage while having no substantial impact on the on-resistance or other on-state characteristics. In particular, slant field plates, such as those described in U.S. patent application Ser. No. 11/841,476, filed Aug. 20, 2007 (now abandoned), are especially desirable in this application. Additionally, multiple field plate structures can be used.

The device in FIG. 7a is similar to that of FIG. 6, except that in this device the metallic cathode contact 28 is connected to metal layer 38 which extends to the backside of the device through vias 33. The same numbers in FIGS. 6 and 7a correspond to the same layers. In this device, prior to deposition of layer 23, cathode contact 28 is deposited and region 32, which includes portions of layers 22 and 24, is rendered n-type or conducting, for example by a method such as ion-implantation, diffusion, or epitaxial regrowth, or by annealing the device such that cathode contact 28 forms an alloy with the semiconductor material in region 32. In some embodiments, an n-type dopant such as Si is implanted into region 32, and after the deposition of cathode contact 28, the sample is annealed such that cathode contact 28 forms an alloy with the semiconductor material in region 32, resulting in a low-resistance ohmic contact between cathode contact 28 and the material in region 32.

Cathode contact 28 also serves as an etch stop for via 33 and can be comprised of any metal or combination of metals that results in an ohmic contact to layer 24 in region 32 and can also serve as an etch stop for the etch of via 33. Via 33 is then etched through the back of the wafer all the way through n-type region 32 to cathode contact 28. Alternatively, in the case where the sample is annealed such that cathode contact 28 forms an alloy with the semiconductor material in region 32, via 33 may extend into region 32 but not all the way to the interface between region 32 and cathode contact 28. Metal layer 38 is then deposited conformally over the backside of the wafer such that it contacts cathode contact 28 or n-type region 32 or both, resulting in the device shown in FIG. 7a. Having a back metal for the cathode can simplify the packaging for the device.

The device in FIG. 7b is the same as that in FIG. 7a, except that substrate 20 is removed prior to deposition of metal layer 38. Although this structure may be more brittle than that of FIG. 7a, it offers the advantage that on-state current can potentially flow both laterally through the 2DEG and vertically through layer 22, thereby reducing the device on-resistance. Additionally, the device in FIG. 7b may exhibit better thermal properties, since substrate 20 is often comprised of a material which exhibits poor thermal conductivity.

Figure 8:
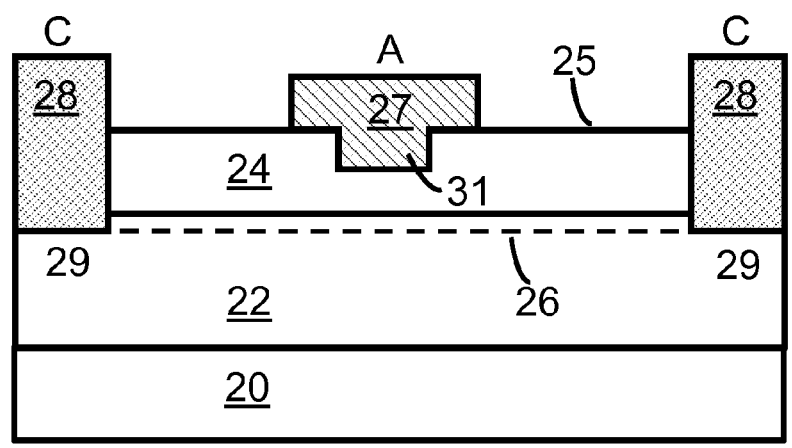
FIG. 8 is a cross-sectional view of an embodiment of a semiconductor diode.
Figure 9:
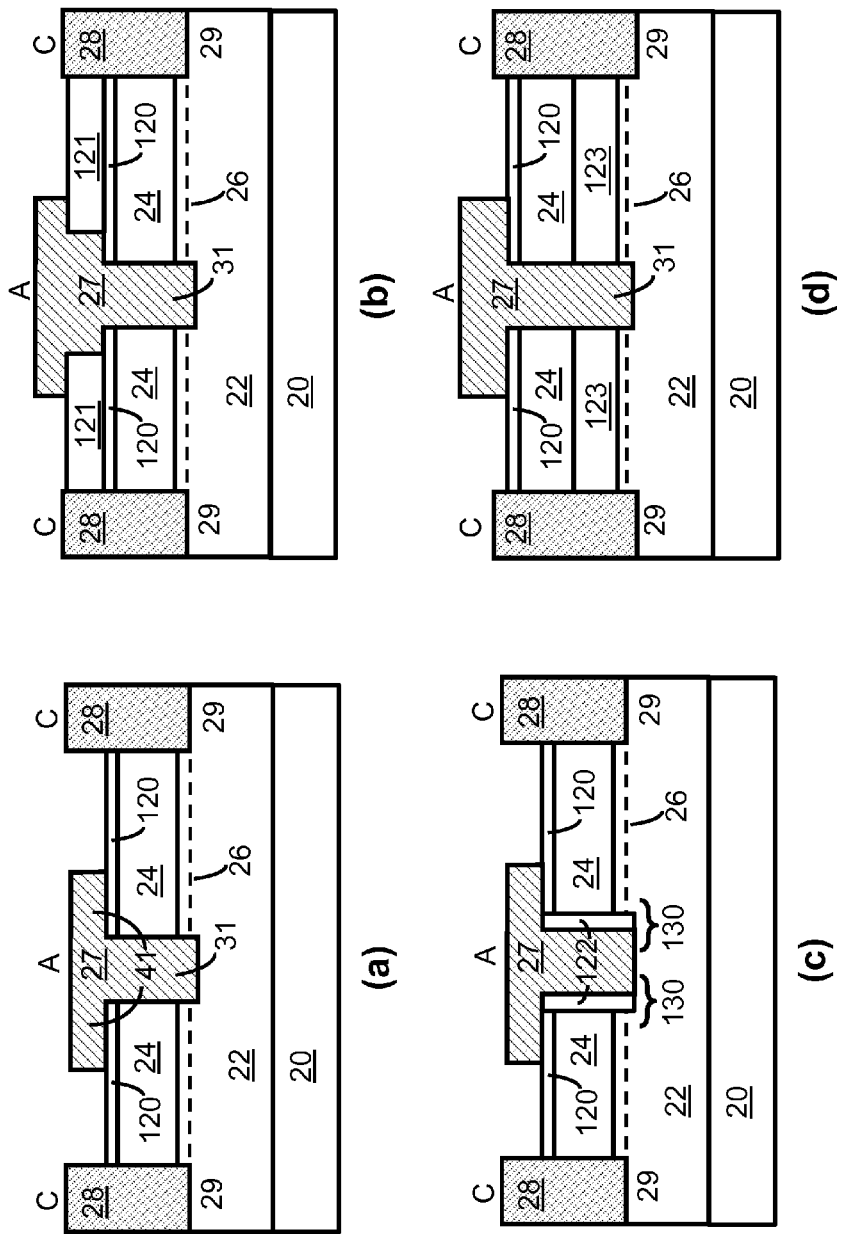
FIGS. 9a, 9b, 9c, and 9d are cross-sectional views of other embodiments of semiconductor diodes.
Figure 10:
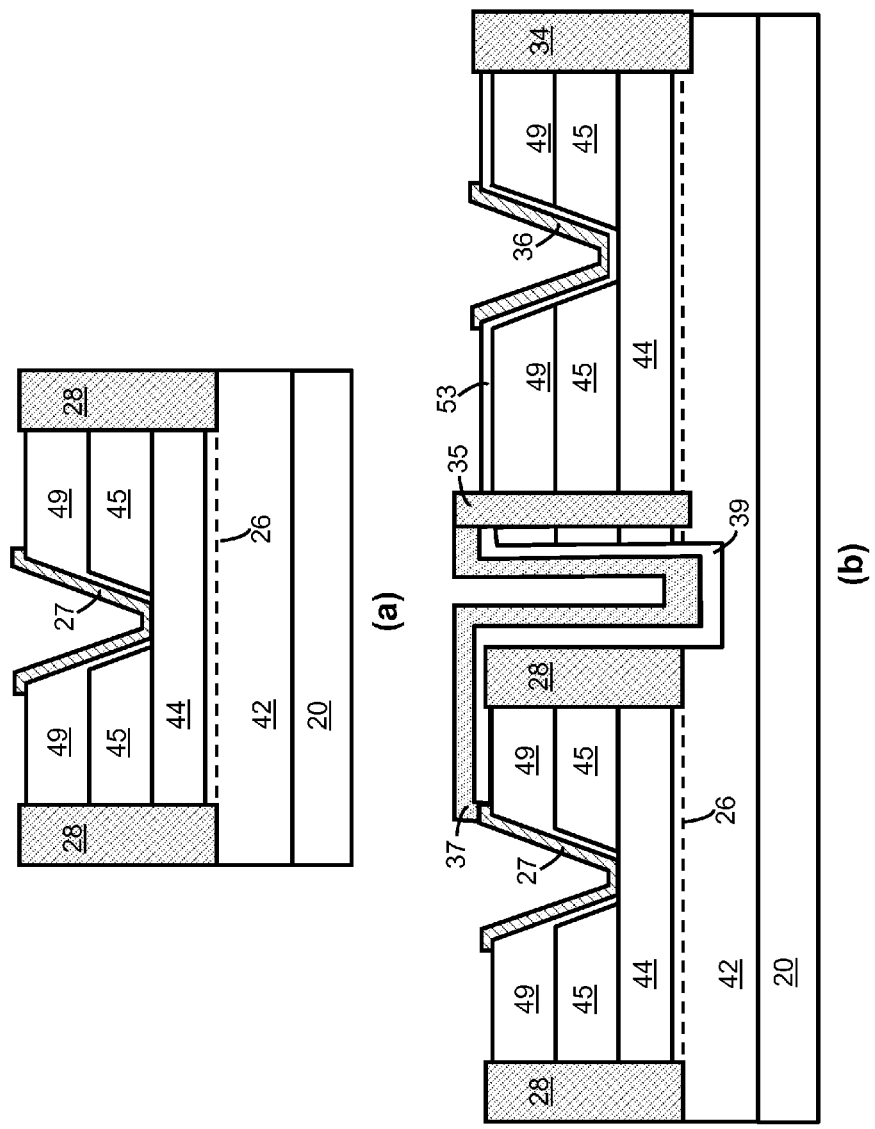
FIG. 10a is a cross-sectional view of an embodiment of a semiconductor diode.
FIGS. 10b and 10c are cross-section and plan views, respectively, of the device in FIG. 10a integrated in series with a HEMT device.
FIG. 10d is a circuit schematic for the layout in FIGS. 10b and 10c.
Figure 10:
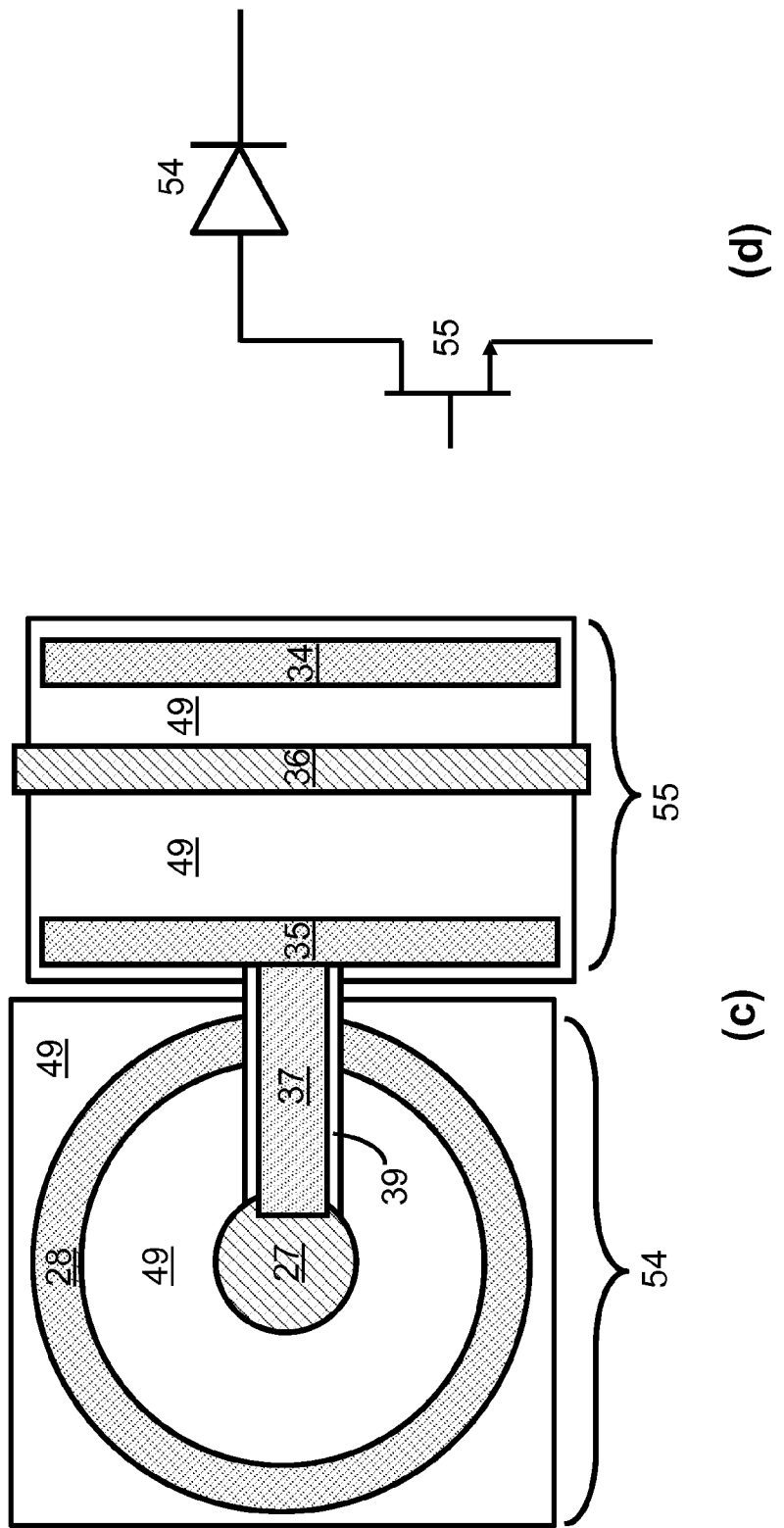
Figure 11:
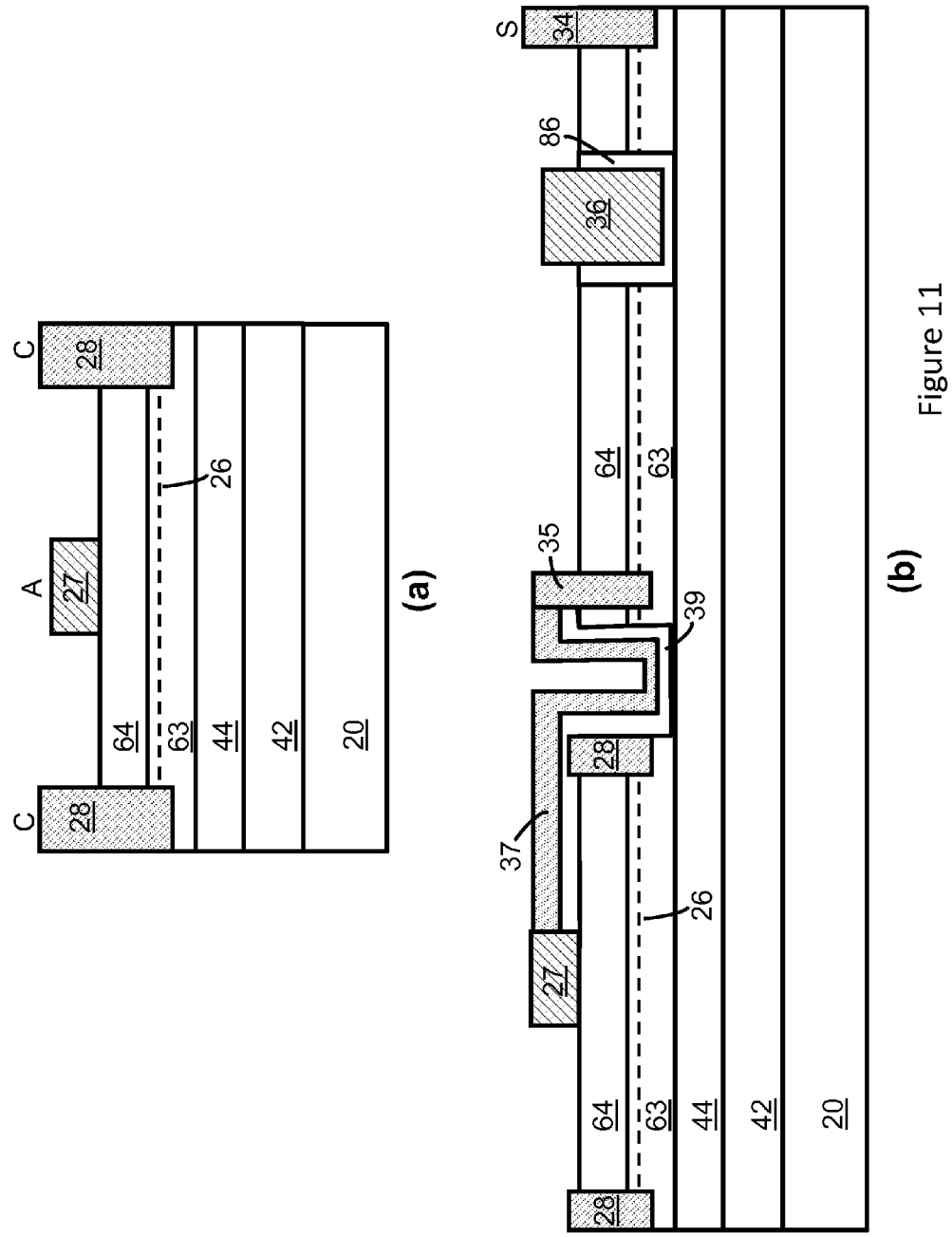
FIG. 11a is a cross-sectional view of an embodiment of a semiconductor diode.
FIGS. 11b and 11c are cross-sectional and plan views, respectively, of the device in FIG. 11a integrated in series with a HEMT device.
FIG. 11d is a circuit schematic for the layout in FIGS. 11b and 11c.
Figure 11:
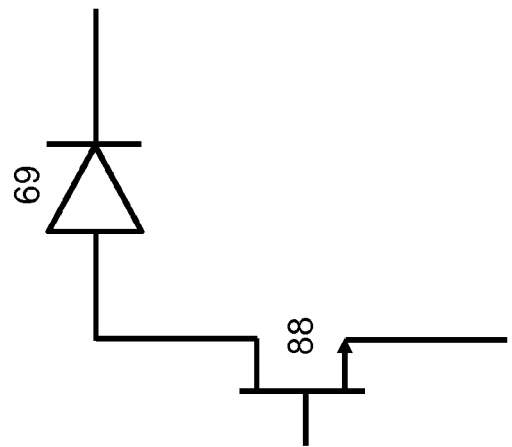
Figure 11:
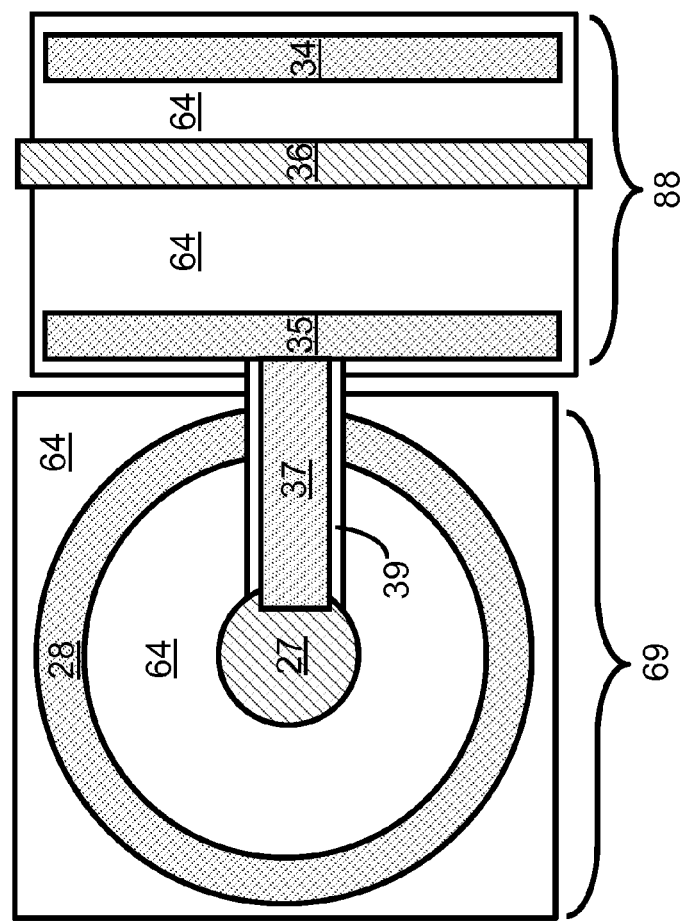
Figure 12:
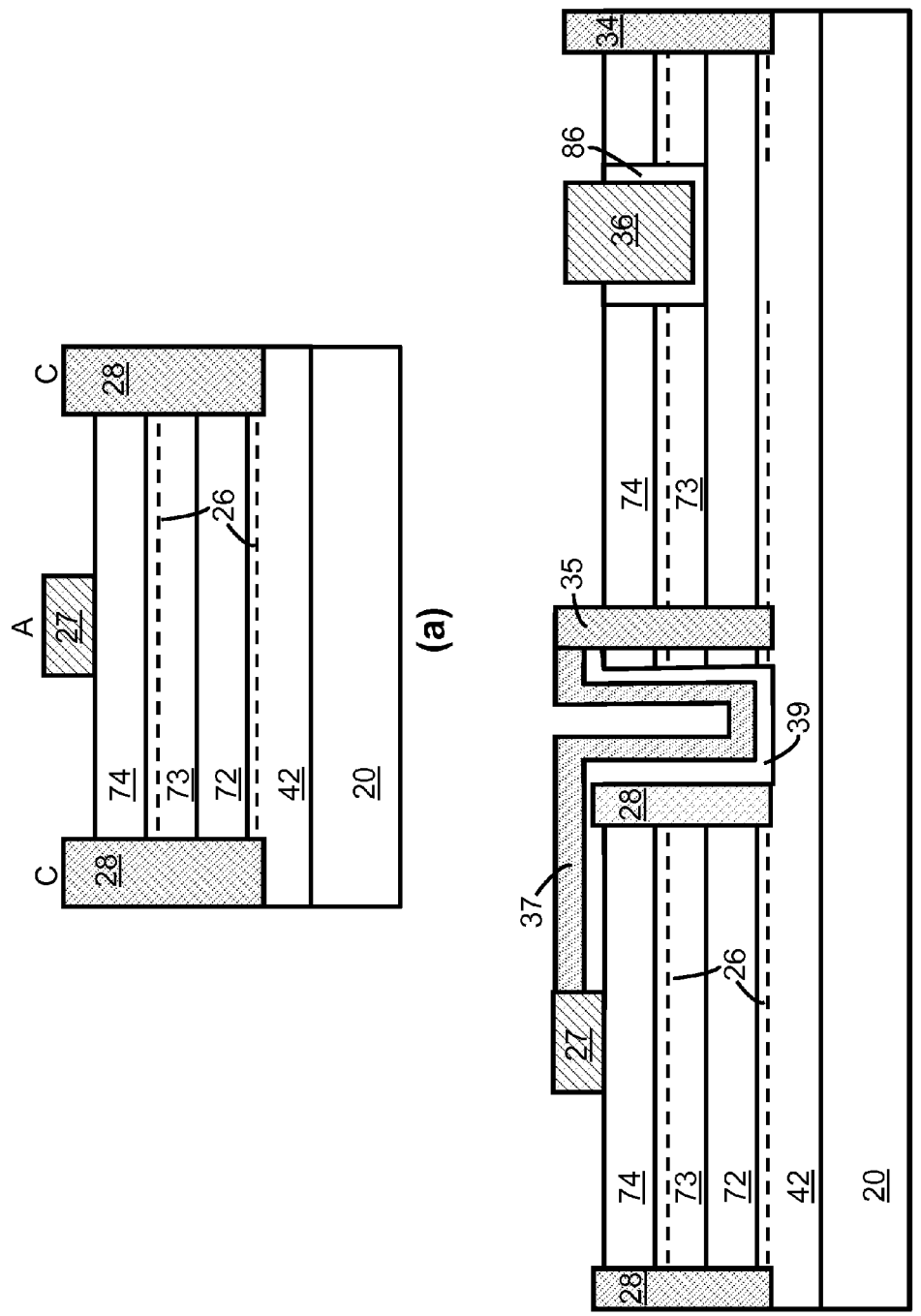
FIG. 12a is a cross-sectional view of an embodiment of a semiconductor diode.
FIGS. 12b and 12c are cross-sectional and plan views, respectively, of the device in FIG. 12a integrated in series with a HEMT device.
FIG. 12d is a circuit schematic for the layout in FIGS. 12b and 12c.
Figure 12:
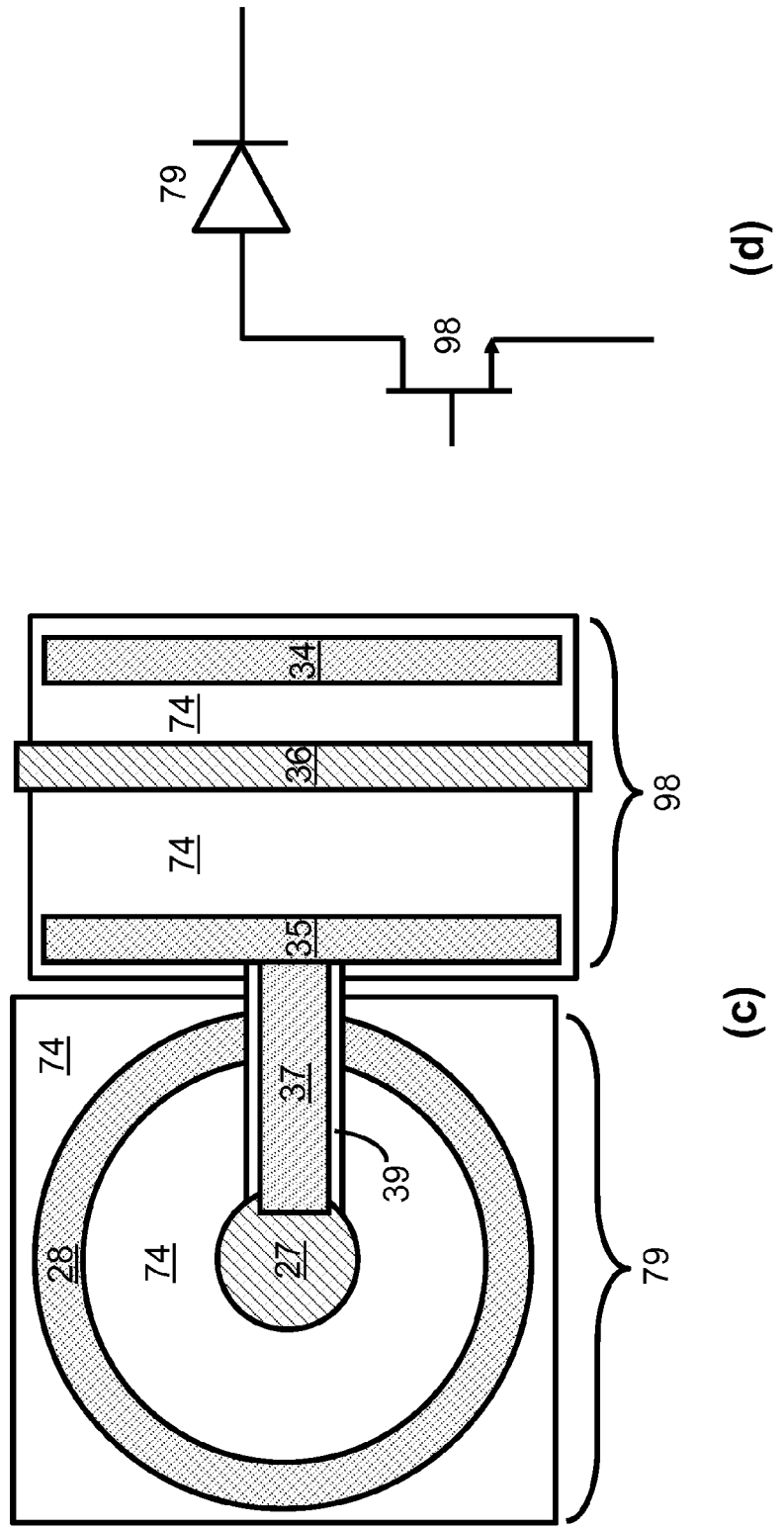

The device in FIG. 8 is similar to that of FIG. 4a, but here layer 24 of the diode also includes a recess 31 in layer 24 underneath a portion of the anode contact 27. The same numbers in FIGS. 4a and 8 correspond to the same items. The anode recess can have the same effect as a field plate, reducing the peak electric field at the edge of the anode and increasing the reverse-bias breakdown voltage. Additionally, the recess potentially reduces the series resistance from anode to cathode when the device is in the ON state, thereby reducing the on-resistance.

The device in FIG. 9a is similar to that of FIG. 8, but here the recess 31 extends all the way through layer 24 and through part of layer 22. In this device, anode contact 27 directly contacts layer 22, forming a Schottky contact with said layer. The device also includes insulator layer 120 on top of layer 24, with a portion 41 of the anode contact formed on top of insulator layer 120. Insulator layer 120 can protect the surface of semiconductor layer 24 from being damaged during device fabrication. When this device is reverse biased, the reverse biased Schottky junction between anode contact 27 and layer 22 prevents current from flowing through the device. Additionally, during reverse bias operation, the portion of 2DEG 26 directly underneath portion 41 of the anode contact is depleted of electrons, thereby reducing reverse leakage currents in the device. In order for the portion of 2DEG 26 directly underneath portion 41 of the anode contact to become depleted of electrons during reverse bias operation, insulator layer 120 cannot be too thick. In some embodiments, insulator layer 120 is less than about 7 nm, less than about 5 nm, or less than about 3 nm. In some embodiments, insulator layer 120 is SiN and is deposited by metal-organic chemical vapor deposition (MOCVD). In some embodiments, insulator layer 120 also functions as a surface passivation layer. The device can also include a second insulator layer 121 on top of a portion of insulator layer 120, as illustrated in FIG. 9b. In the embodiment shown in FIG. 9b, anode contact 27 extends over part of the second insulator layer 121, thereby forming a field plate. In some embodiments, the second insulator layer 121 is SiN. In other embodiments, the device further includes a sidewall insulator 122 between anode contact 27 and the 2DEG 26, as illustrated in FIG. 9c. The sidewall insulator 122 can reduce reverse leakage currents. In embodiments where a sidewall insulator 122 is included, when a forward bias is applied, current flows from the anode into semiconductor layer 22 through the interface between anode contact 27 and semiconductor layer 22, then through region 130 in semiconductor layer 22, and then through the 2DEG to the cathode contact 28. As illustrated in FIG. 9d, in some embodiments, an additional III-V semiconductor layer 123, such as AlN, is included in between layers 22 and 24. This layer can increase the carrier mobility in the 2DEG 26, which leads to a reduction in the forward-bias resistance of the device.

FIG. 10a shows a diode which is similar to that shown in FIG. 4a, but further includes a deep recess underneath the anode contact. As used herein, the term "deep recess" refers to a recess that is substantially deeper than the thickness of the second III-N layer 44, such as at least 5 times thicker or at least 10 times thicker. This device includes a substrate 20, a first III-N layer 42, a second III-N layer 44, and furthermore includes a third III-N layer 45 and an insulator 49. A 2DEG 26 is induced in the first III-N layer 42 near the interface between layers 42 and 44. III-N layer 45 is substantially thicker than layer 44, such as at least 5 times thicker or at least 10 times thicker. Part or all of III-N layer 45 can be doped n-type in order to increase the conductivity of the 2DEG 26. Insulator 49 serves as a surface passivation layer and also prevents anode contact 27 from directly contacting III-N layer 45.

In some embodiments of this device, the first III-N layer 42 is GaN, the second III-N layer 44 is $Al_xGa_{1-x}N$, where x is about 0.27, and the third III-N layer 45 is GaN and is delta-doped with Si. The second III-N layer 44 is about 30 nm thick, and the third III-N layer 45 is about 250 nm thick. In this structure, the uppermost semiconductor surface can be substantially farther from the 2DEG than in the structures shown in FIGS. 4-8, which can suppress surface-related effects, such as dispersion. Additionally, this device can be easily integrated with a III-N HEMT for which the III-N layer structure is similar to that of this device. FIGS. 10b and 10c show cross-sectional and plan views, respectively, of a diode 54 of this embodiment in series with a III-N HEMT 55, integrated on the same chip. The HEMT 55 includes source and drain ohmic contacts 34 and 35, respectively, and gate contact 36, and may optionally include features well known in the art, such as a gate insulator 53. The diode is electrically connected to the HEMT by an interconnect 37, which can be isolated from the semiconductor layers by including an insulator 39 between the semiconductor surfaces and the interconnect. In general, the interconnects can connect either of the two diode terminals to any of the three HEMT terminals. The circuit schematic for this layout is shown in FIG. 10d.

FIGS. 11a and 12a show diodes which may be easily integrated with III-N enhancement-mode HEMT devices that were disclosed in U.S. patent application Ser. No. 12/108,449, filed Apr. 23, 2008, which is hereby incorporated by reference throughout. It is particularly desirable to be able to integrate diodes with enhancement-mode devices, because enhancement-mode devices and diodes are commonly used together in power switching circuit applications.

The device of FIG. 11a includes a substrate 20, a first III-N layer 42 on the substrate 20, a second III-N layer 44 on top of the first III-N layer, a third III-N layer 63 on top of the second III-N layer, and a fourth III-N layer 64 on top of the third III-N layer. The specific requirements for layers 42, 44, 63, and 64 are the same as those of layers 94, 98, 95, and 100, respectively, in FIG. 13a of U.S. patent application Ser. No. 12/108,449. The material of the first III-N layer 42 is selected from the group consisting of nitrides of gallium, indium and aluminum, and combinations thereof. The second III-N layer 44 is AlXN, where X is selected from the group consisting of gallium, indium or their combination. A III-N layer 63 is adjacent the AlXN layer, that includes two channel access regions. This III-N layer can be GaN, InN, or a combination of the two, preferably GaN. In one embodiment of this device, layer 64 is $Al_mGa_{1-m}N$ and is used for enabling the 2DEG charge in the channel access regions. The exact compositions of layers 42, 44, 63, and 64 are chosen such that a 2DEG 26 is induced in III-N layer 63 near the interface between layers 63 and 64, as described in U.S. patent application Ser. No. 12/108,449. The device also includes an anode Schottky contact 27 or a plurality of contacts atop layer 64, and a cathode contact 28 or plurality of contacts contacting the 2DEG 26. In one embodiment of this device, layer 42 is GaN, layer 44 is $Al_xGa_{1-x}N$, where x is in the range of about 0.05 to 0.25 and layer 44 is about 5-10 nm thick, layer 63 is GaN and is about 5-30 nm thick, and layer 64 is $Al_mGa_{1-m}N$, where m is in the range of about 0.1 to 0.3 and the thickness of the layer 64 is in the range of about 10-50 nm, the composition and thickness ranges being selected to achieve an equivalent sheet resistance of under 700 ohms/square in the 2DEG region. FIGS. 11b and 11c show cross-sectional and plan views, respectively, of the diode of FIG. 11a 69 integrated with an enhancement-mode HEMT 88, and FIG. 11d shows a circuit schematic of this configuration. In FIGS. 11b and 11c, layers 39 and 86 are insulators such as SiN.

The device of FIG. 12a includes a substrate 20, a first III-N layer 42 on the substrate, a second III-N layer 72 on top of the first III-N layer, a third III-N layer 73 on top of the second III-N layer, and a fourth III-N layer 74 on top of the third III-N layer. The specific requirements for layers 42, 72, 73, and 74 are the same as those of layers 94, 98, 95, and 100, respectively, in FIG. 14a of U.S. patent application Ser. No. 12/108,449. The exact compositions of layers 42, 72, 73, and 74 are chosen such that a 2DEG 26 is induced in III-N layer 73 near the interface between layers 73 and 74 and a 2DEG 26 is induced in III-N layer 42 near the interface between layers 42 and 72, as described in U.S. patent application Ser. No. 12/108,449. The device also includes an anode Schottky contact 27 or a plurality of contacts atop layer 74, and a cathode contact 28 or plurality of contacts contacting the 2DEG 26 in layer 73. The cathode contact 28 can optionally also contact the 2DEG 26 in layer 42, as shown. In order for a 2DEG 26 to be induced in layer 42, the Al composition and/or thickness of III-N layer 72 is greater than that of layer 44 in FIG. 11a if layers 42, 73, and 74 in FIG. 12a have the same thicknesses and compositions as FIGS. 42, 63, and 64, respectively, in FIG. 11a. FIGS. 12b and 12c show cross-sectional and plan views, respectively, of the diode of FIG. 12a 79 integrated with an enhancement-mode HEMT 98, and FIG. 12d shows a circuit schematic of this configuration.

Figure 13:
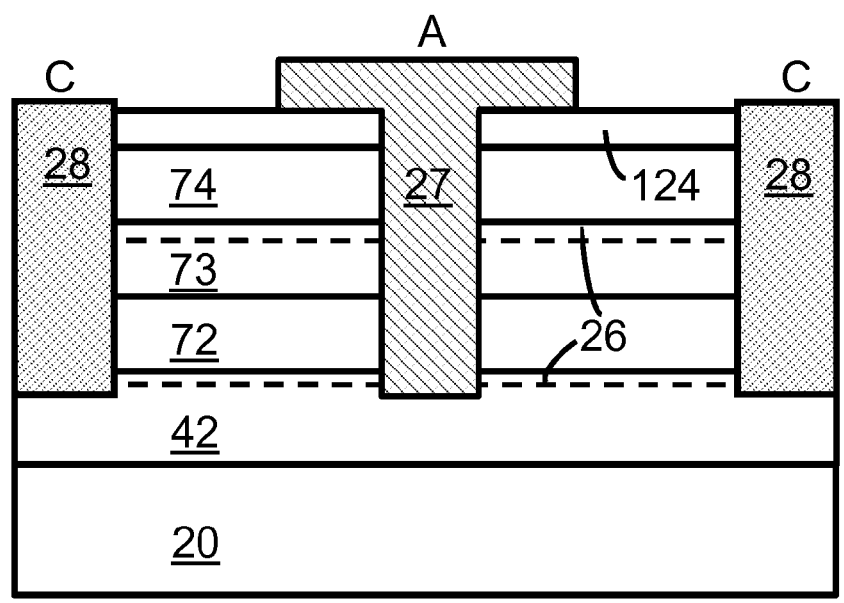
FIG. 13 is a cross-sectional view of an embodiment of a semiconductor diode.
Figure 14:
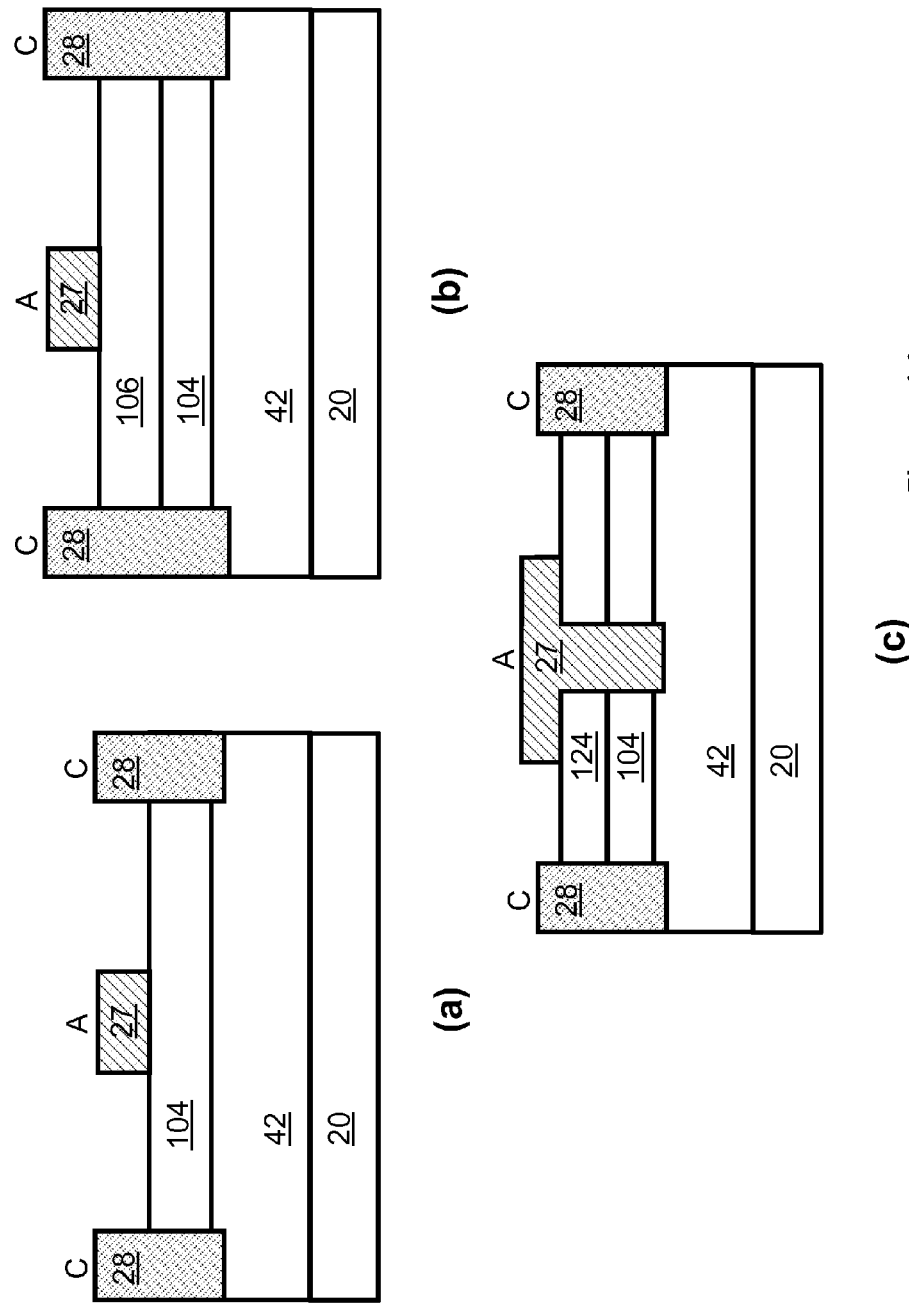
FIGS. 14a, 14b, and 14c are cross-sectional views of embodiments of semiconductor diodes.
Figure 15:
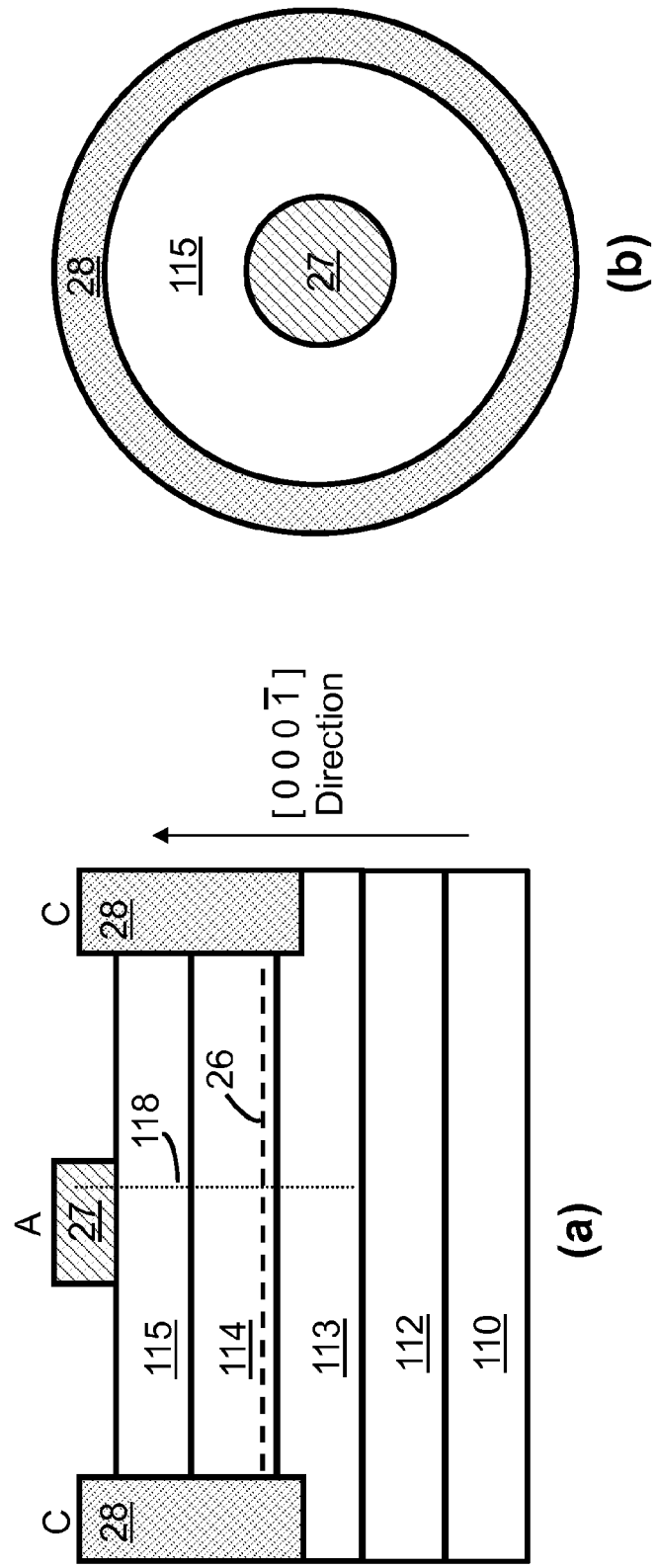
FIGS. 15a and 15b are cross-sectional and plan views, respectively, of an embodiment of a semiconductor diode.

The device shown in FIG. 13 is similar to that shown in FIG. 12a, but here a portion of the semiconductor material underneath the anode contact 27 is recessed, such that the recess terminates inside III-N layer 42. In this device, anode contact 27 directly contacts layers 42, 72, 73, and 74, forming Schottky contacts with layers 42 and 73. In some embodiments, the device also includes insulator layer 124 on top of layer 74, with a portion of the anode contact formed on top of insulator layer 124. In some embodiments, insulator layer 124 is SiN. In some embodiments, the device also includes a sidewall insulator in the anode recess (not shown), similar to layer 122 in FIG. 9c. In other embodiments, the device includes an additional III-N layer, such as AlN, between layers 73 and 74 (not shown).

FIGS. 14a-14b show embodiments of this invention that include compositionally graded III-N layers. For an $Al_xGa_{1-x}N$ layer oriented in the polar [0 0 0 1] direction or in a semi-polar Ga-terminated orientation, if x is not constant throughout the layer but rather monotonically increases from the bottom of the layer (N-polar face) to the top of the layer (Ga-polar face), the polarization fields in the layer cause it to be doped n-type. This is known as polarization doping, and the resulting doping profile is a 3-dimensional distribution sometimes referred to as a 3-dimensional electron gas, or 3DEG. The exact doping profile in the layer is determined by the grading profile of x. For example, a linear grade for x results in an approximately constant doping throughout the layer. Other grading profiles, such as exponential grades or parabolic grades, result in different doping profiles. A similar effect may be achieved by grading $In_yGa_{1-y}N$. In this case, if y decreases monotonically from the N-polar face to the Ga-polar face, the polarization fields in the layer cause it to be doped n-type.

The diode in FIG. 14a includes a substrate 20, on top of which is formed a III-N layer 42, on top of which is formed a compositionally graded III-N layer 104 which contains a channel consisting of a polarization-induced charge distribution. III-N layer 104 is graded to induce n-type conductivity within the layer, as was described above. In some cases, the III-N materials are oriented in the polar [0 0 0 1] direction or in a semi-polar Ga-terminated orientation. Depending on the grading profile in III-N layer 104, the channel is distributed over the entire layer 104, or is only distributed over a portion of layer 104. An anode Schottky contact 27 or plurality of contacts is formed atop layer 104, and a cathode contact 28 or plurality of contacts is formed that makes a significantly ohmic contact with the polarization-induced channel in layer 104. In some implementations of this embodiment, III-N layer 42 is GaN, either semi-insulating or $n^-$-doped or n-doped, and III-N layer 104 is $Al_xGa_{1-x}N$, where x is about zero at the interface of layers 102 and 104 and increases monotonically up to the upper surface of layer 104. In some embodiments, at the upper surface of layer 104, x is between about 0.1 and 0.3. One of the advantages to this structure is that the composition of the upper surface of the upper III-N layer 104 can be more easily adjusted to obtain different Schottky barrier heights while still resulting in a highly conductive channel in layer 104.

The diode in FIG. 14b is similar to that in FIG. 14a, but further includes an additional III-N layer 106 atop layer 104 but below anode contact 27. When layer 104 is $Al_xGa_{1-x}N$ and is graded as described above, III-N layer 106 is GaN or $Al_zGa_{1-z}N$. In some applications, z is larger than the maximum value of x, thereby resulting in an additional 2-dimensional charge distribution (2DEG) in layer 104, which increases the conductivity of that layer and thereby may reduce the diode on-resistance. In other applications, z is less than the maximum value of x, possibly even zero, thereby reducing the diode Schottky barrier height. The devices in FIGS. 14a and 14b can both be modified to include a backside cathode contact, such as shown for the devices in FIGS. 7a and 7b.

The diode in FIG. 14c is similar to that in FIG. 14a, but here a portion of the semiconductor material underneath the anode contact 27 is recessed, such that the recess terminates inside III-N layer 42. In some embodiments, the device also includes insulator layer 124 on top of layer 104, with a portion of the anode contact formed on top of insulator layer 124. In some embodiments, insulator layer 124 is SiN.

FIG. 15a shows a cross-sectional view of a diode which is fabricated on III-N semiconductor material that is either oriented in the N-polar [0 0 0 1 bar] direction or is a nitrogen-terminated semipolar material. A plan view of this device is shown in FIG. 15b. The device includes a substrate 110 which is suitable for growth of N-polar or semipolar III-N materials. Layer 112 is a buffer layer, such as GaN, which reduces the defect density in the overlying material. In some cases, it is possible to omit layer 112 and grow layer 113 directly on the substrate. The compositions of layers 113, 114, and 115 are chosen such that a 2DEG 26 is induced in layer 114 near the interface between layers 113 and 114. In some embodiments, 2DEG 26 can be induced by choosing III-N materials for layers 113 and 115 which have larger bandgaps than that of layer 114. In some embodiments, layer 113 is $Al_mGa_{1-m}N$, where 'm' is between about 0.25 and 0.35, layer 114 is GaN, and layer 115 is $Al_rGa_{1-r}N$, where 'r' is between about 0.25 and 0.35. The device can also be designed with a backside cathode contact, similar to the structure shown in FIGS. 7a and 7b. The diode can also be integrated with other devices, such as III-N HEMTs. The structure shown in FIG. 15a can be advantageous as compared to other Schottky diodes because reverse bias barrier lowering is reduced, thereby reducing the reverse leakage currents in the device.

Figure 1:
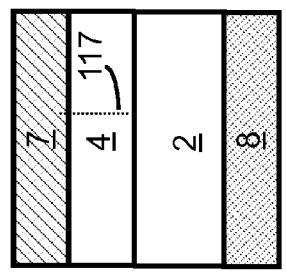
FIG. 1 is a cross-sectional view of a diode device of the prior art.
Figure 2:
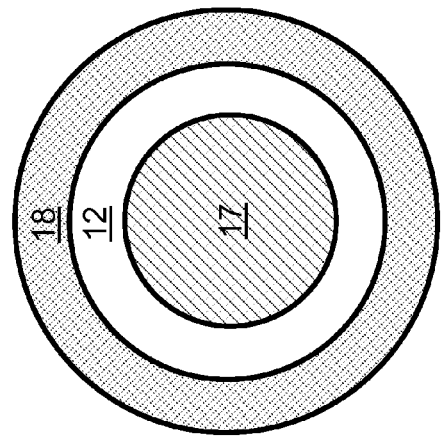
FIGS. 2a and 2b are cross-sectional and plan views, respectively, of a diode device of the prior art.
Figure 2:
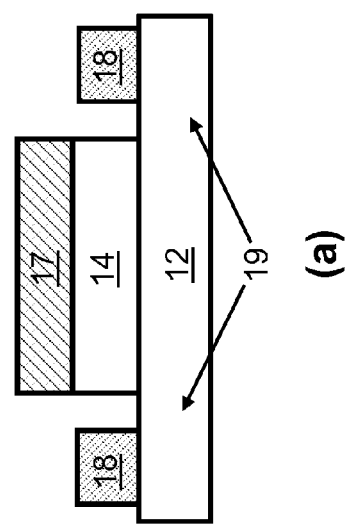
Figure 3:
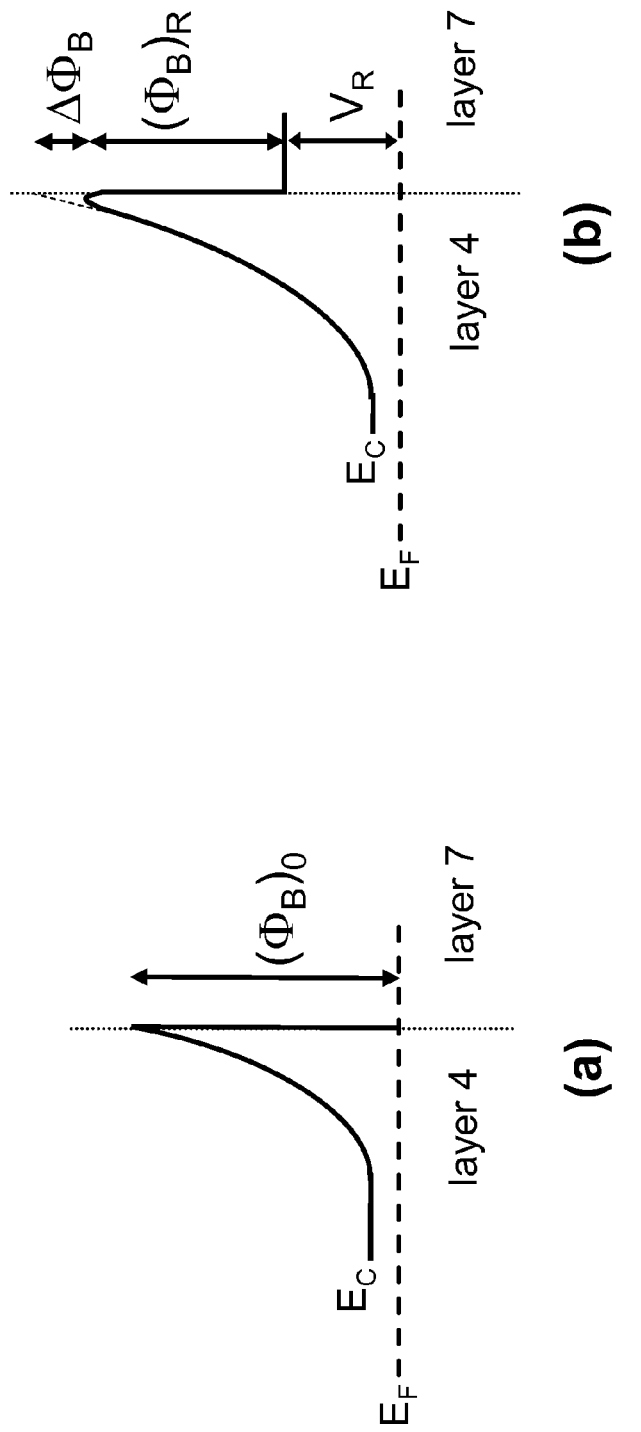
FIGS. 3a and 3b are band diagrams of the device in FIG. 1 during various operating conditions.
Figure 16:
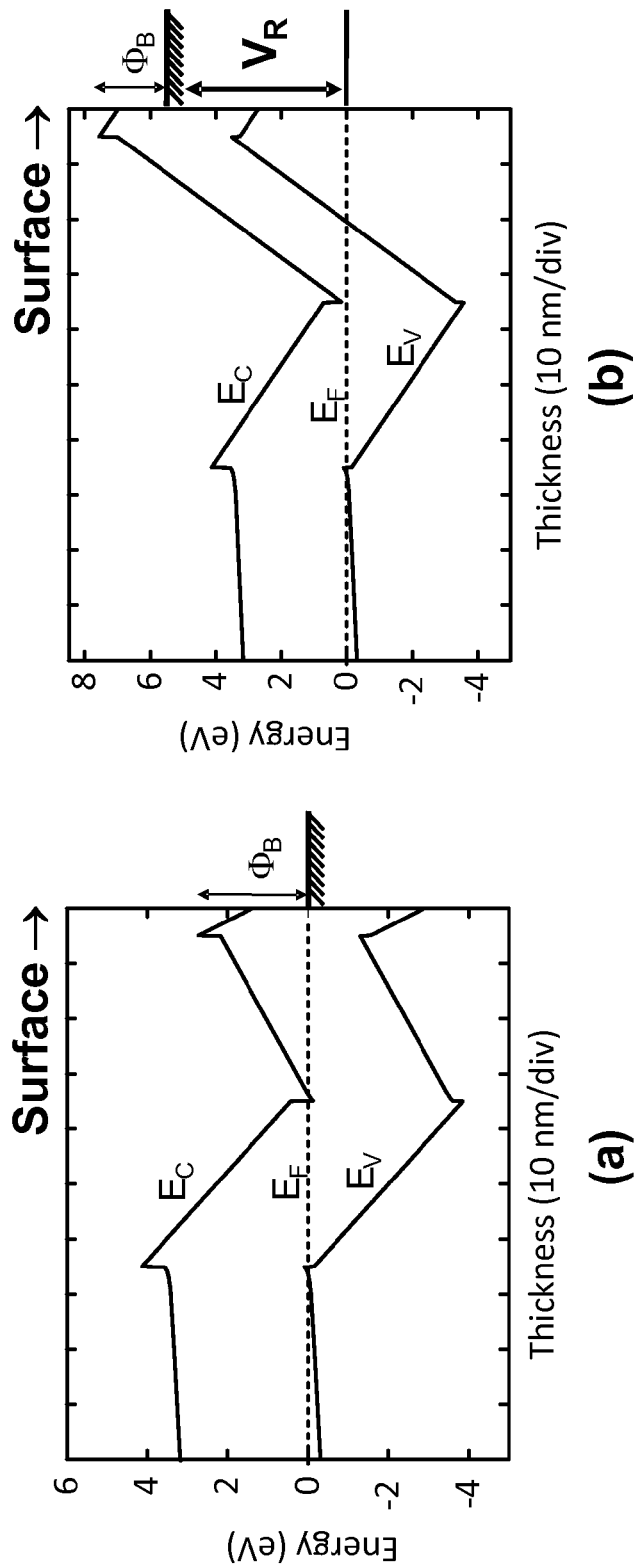
FIGS. 16a and 16b are band diagrams of the device in FIG. 15a during various operating conditions.

For the device in FIG. 15a, a band diagram along line 118 when anode contact 27 and cathode contact 28 are at the same voltage is shown in FIG. 16a, and FIG. 16b shows a band diagram along this line when the diode is reverse biased, i.e., anode contact 27 is at a lower voltage than the cathode contact 28. For these band diagrams, $Al_mGa_{1-m}N$ layer 113 is 30 nm thick with Al composition m=0.3, GaN layer 114 is 30 nm thick, and $Al_rGa_{1-r}N$ layer 115 is 5 nm thick with Al composition r=0.3. In this structure, the electric field in layer 115 opposes electron reverse leakage flow. When a reverse bias is applied (FIG. 16b), the electric field in layer 115 is decreased, and so the Schottky barrier height $\Phi_B$ remains about the same, or is not substantially reduced, as compared to the case when anode contact 27 and cathode contact 28 are at the same voltage (FIG. 16a). For example, when the device is reverse biased such that the maximum electric field $E_{max}$ in the device is greater than about $(0.5)*E_{br}$, where $E_{br}$ is the breakdown field of the material, the Schottky barrier height $\Phi_B$ may be reduced by less than 15%, less than 10%, less than 5%, or less than 1% of its value when zero bias is applied. Consequently, barrier lowering in this structure can be suppressed as compared to the structure in FIG. 1, and so reverse leakage currents can be reduced.

Furthermore, layer 113 can be doped to induce further charge at the interface between layers 113 and 114. The doping in layer 113 can be used to keep the valence band of layers 112 and 113 away from the Fermi level to prevent dispersion. In addition to the doping, the aluminum composition of layer 113 can also be graded to keep the valence band of layers 112 and 113 away from the Fermi level. Additionally, the doping profile in layer 113 can be designed such that only the bottom part of layer 113 is doped, while the portion of layer 113 adjacent to layer 114 is not doped, in order to prevent impurity scattering at the interface between layers 113 and 114. More details of the doping and grading designs for these layers can be found in U.S. patent application Ser. No. 11/523,286, filed Sep. 18, 2006 (now U.S. Pat. No. 7,948, 011).

What is claimed is:

1. A diode, comprising:
   a semiconductor material comprising a first III-N material layer and a second III-N material layer, wherein a 2DEG channel is in the first III-N material layer because of a compositional difference between the first III-N material layer and the second III-N material layer;
   a first insulator layer on the semiconductor material; and
   a first terminal and a second terminal, wherein the first terminal comprises an anode that forms a Schottky contact with the semiconductor material and includes an extending portion that extends over the first insulator layer, and a second terminal is a single cathode in ohmic contact with the 2DEG channel.

2. The diode of claim 1, wherein when the diode is forward biased, current flows from the anode to the cathode predominantly through a Schottky barrier and through the 2DEG channel.

3. The diode of claim 1, wherein the first III-N material layer includes GaN and the second III-N material layer includes $Al_aGa_{1-a}N$.

4. The diode of claim 1, wherein the extending portion comprises a field plate.

5. The diode of claim 1, wherein the extending portion comprises multiple field plates formed as a plurality of steps.

6. The diode of claim 5, wherein the first insulator layer surrounds the anode and is between the field plate and the second III-N material layer.

7. An assembly, comprising:
   the diode of claim 1; and
   a III-N transistor, wherein a terminal of the two terminals of the diode is electrically connected to a terminal of the III-N transistor.

8. The assembly of claim 7, wherein the terminal of the III-N transistor is a drain, and the anode of the diode is electrically connected to the drain of the III-N transistor.

9. The assembly of claim 8, wherein the diode and the III-N transistor are on a common substrate.

10. The diode of claim 1, wherein the second III-N material layer is between the first insulator layer and the first III-N material layer.

11. The diode of claim 10, wherein the Schottky contact is formed with the second III-N material layer.

12. The diode of claim 10, wherein the second III-N material layer has a thickness, and the anode extends through an entirety of the thickness of the second III-N material layer to contact the first III-N material layer.

13. The diode of claim 1, wherein the first and second III-N material layers are N-polar or nitrogen-terminated semi-polar material.

14. The diode of claim 13, wherein the anode contacts an N-face of the semiconductor material.

15. The diode of claim 1, wherein the semiconductor material further includes a third III-N material layer and a fourth III-N material layer.

16. The diode of claim 15, wherein a second 2DEG channel is induced in the third III-N material layer adjacent to the fourth III-N material layer.

17. The diode of claim 1, further comprising:
a second insulator layer on the first insulator layer; and
a field plate, wherein the field plate extends from the extending portions of the anode and the second insulator layer is between the field plate and the first insulator layer.

18. The diode of claim 1, further comprising a sidewall insulating material surrounding a lateral sidewall of the anode, wherein a horizontal portion of the anode contacts the first III-N material layer.

19. The diode of claim 1, further comprising a third III-N material layer between the first III-N material layer and the second III-N material layer.

20. The diode of claim 19, wherein the third III-N material layer comprises AlN.

21. A diode, comprising:
a semiconductor material comprising a first III-N material layer and a second III-N material layer, wherein a 2DEG channel is in the first III-N material layer because of a compositional difference between the first III-N material layer and the second III-N material layer;
a first insulator layer on the semiconductor material;
a second insulator layer on the first insulator layer; and
a first terminal and a second terminal, wherein the first terminal comprises an anode that forms a Schottky contact with the semiconductor material and includes an extending portion that extends over the second insulator layer, and a second terminal is a single cathode in ohmic contact with the 2DEG channel.

22. The diode of claim 21, wherein the second insulator layer is between the extending portion and the first insulator layer.

23. The diode of claim 21, wherein the anode contacts the first and second insulator layers.

24. The diode of claim 21, wherein the second III-N material layer has a thickness, and the anode extends through an entirety of the thickness of the second III-N material layer to contact the first III-N material layer.

25. A diode, comprising:
a second III-N material layer on a first III-N material layer;
a 2DEG channel in the first III-N material layer;
a first insulator layer over the second III-N material layer; and
a first terminal and a second terminal, the first terminal comprising an anode that includes a field plate, and a second terminal is a single cathode in ohmic contact with the 2DEG channel; wherein
when the diode is forward biased, current flows from the anode to the cathode predominantly through a Schottky barrier and through the 2DEG channel.

26. The diode of claim 25, wherein the field plate comprises an extending portion that extends over the first insulator layer.

27. The diode of claim 26, further comprising a second insulator layer on the first insulator layer.

28. The diode of claim 27, wherein the second insulator layer is at least partially between the extending portion and the first insulator layer.

29. The diode of claim 25, further comprising a third III-N material layer, wherein the first, second, and third III-N material layers comprise N-polar or nitrogen-terminated semi-polar material.

30. The diode of claim 25, wherein the second III-N material layer has a thickness, and the anode extends through an entirety of the thickness of the second III-N material layer.

31. The diode of claim 25, further comprising a third III-N material layer between the first III-N material layer and the second III-N material layer.

32. The diode of claim 31, wherein the third III-N material layer comprises AlN.

* * * * *